United States Patent
Park et al.

(10) Patent No.: US 7,342,827 B2
(45) Date of Patent: Mar. 11, 2008

(54) CHARGE TRAP-TYPE 3-LEVEL NON-VOLATILE SEMICONDUCTOR MEMORY DEVICE AND METHOD OF DRIVING THE SAME

(75) Inventors: Ki-Tae Park, Gyeonggi-do (KR); Jung-Dal Choi, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 235 days.

(21) Appl. No.: 11/341,341

(22) Filed: Jan. 26, 2006

(65) Prior Publication Data
US 2007/0030756 A1   Feb. 8, 2007

(30) Foreign Application Priority Data
Aug. 5, 2005   (KR) .................. 10-2005-0071844

(51) Int. Cl.
G11C 11/34 (2006.01)
(52) U.S. Cl. .................. 365/185.12; 365/185.03; 365/185.18
(58) Field of Classification Search ............ 365/238.5, 365/185.12, 185.03, 185.09, 185.05, 185.27
See application file for complete search history.

(56) References Cited

U.S. PATENT DOCUMENTS

| | | | |
|---|---|---|---|
| 5,966,326 A * | 10/1999 | Park et al. ............ | 365/185.11 |
| 6,490,204 B2 | 12/2002 | Bloom et al. | |
| 6,649,972 B2 | 11/2003 | Eitan | |
| 6,853,587 B2 | 2/2005 | Forbes | |
| 7,130,215 B2 * | 10/2006 | Yeh ...................... | 365/185.01 |
| 7,218,554 B2 * | 5/2007 | Hsu et al. ............. | 365/185.25 |
| 2007/0195597 A1 * | 8/2007 | Park et al. ............ | 365/185.03 |

FOREIGN PATENT DOCUMENTS

KR   2005-0040667   5/2005

OTHER PUBLICATIONS

English language abstract of Korean Publication No. 2005-0040667.

* cited by examiner

*Primary Examiner*—Anh Phung
*Assistant Examiner*—Hien Nguyen
(74) *Attorney, Agent, or Firm*—Marger Johnson & McCollom, P.C.

(57) ABSTRACT

Disclosed herein is a charge trap-type 3-level non-volatile semiconductor memory device and method of driving the same. The charge trap-type 3-level non-volatile semiconductor memory device includes a memory array including a plurality of memory elements, each capable of storing data in at least two charge trap regions depending on the direction of current flow, and a page buffer driven to map three data bits to threshold voltage groups of the two charge trap regions. The charge trap-type non-volatile semiconductor memory device has charge trap regions each storing 1.5 bits of data. That is, a single memory element has charge trap regions for storing 3 bits of data, thereby improving device integration while maintaining a high operating speed during programming and reading operations.

24 Claims, 37 Drawing Sheets

CHARGE TRAP-TYPE 3-LEVEL NON-VOLATILE SEMICONDUCTOR MEMORY DEVICE AND METHOD OF DRIVING THE SAME

BACKGROUND OF THE INVENTION

This application claims priority under 35 U.S.C. § 119 to Korean Patent Application No. 2005-71844, filed on Aug. 5, 2005, the contents of which are herein incorporated by reference in its entirety for all purposes.

1. Field of the Invention

The present invention relates, in general, to semiconductor memory devices and, more particularly, to a non-volatile semiconductor memory device, which has memory devices each capable of storing data in at least two charge trap regions depending on the direction of current flow, and a method of driving the non-volatile semiconductor memory device.

2. Description of the Related Art

Recently, a plurality of charge trap-type non-volatile memory devices using a charge storage layer that is made of a nonconducting material capable of locally storing charges, such as SiN, has been announced. Such charge trap-type non-volatile memory devices are advantageous compared to a floating gate-type non-volatile memory device using a floating gate because the manufacturing process is simplified in implementing high-density memory devices. A representative example of the charge trap-type non-volatile memory device is Nitride-storage Read Only Memory (NROM), as shown in FIG. 1. Referring to FIG. 1, NROM has thin film layers 13a, 13b and 13c, implemented with Oxide-Nitride-Oxide (ONO) films, as the insulating film layers of a gate 11 of a transistor.

In a charge trap-type non-volatile memory device, such as NROM, a data program operation is executed by injecting electrons, which are carriers, into the nitride film 13b, which is a charge storage layer. In other words, the charge trap-type non-volatile memory device performs the data program operation depending on variation in a threshold voltage caused by injected charges. Channel Hot-Electron injection (CHE) can be used as an electron injection method. Further, the erasure of data from the non-volatile memory device is performed by eliminating electrons injected into the nitride film 13b. In order to inject electrons, suitable voltages are applied to the gate node 11, first and second junction regions 15a and 15b, and the substrate 17 of the memory device, respectively.

For example, as shown in FIG. 2a, if a supply voltage VDD is applied to the first junction region 15a and a ground voltage VSS is applied to the second junction region 15b, the first junction region 15a acts as a drain D and the second junction region 15b acts as a source S. In this case, electrons are injected into the nitride film 13b near the first junction region 15a, that is, a charge trap region CT1, depending on the voltage level of the gate node 11. Consequently, the charge trap region CT1 is programmed by the increase of a threshold voltage.

Further, as shown in FIG. 2b, if the ground voltage VSS is applied to the first junction region 15a and the supply voltage VDD is applied to the second junction region 15b, the first junction region 15a acts as a source S and the second junction region 15b acts as a drain D. In this case, electrons are injected into the nitride film 13b near the second junction region 15b, that is, a charge trap region CT2, depending on the voltage level of the gate node 11. That is, the charge trap region CT2 is programmed by the increase of a threshold voltage.

Further, the reading of data stored in the charge trap regions CT1 and CT2 is performed by inversely controlling the direction of current flow used for programming. For example, as shown in FIG. 3a, if the supply voltage VDD is applied to the second junction region 15b, data stored in the charge trap region CT1 near the first junction region 15a is read as the voltage level of a bit line BL connected to the first junction region 15a depending on the voltage level of the gate node 11. That is, when the charge trap region CT1 is programmed, it is in a "turned off" state. In this case, the voltage level of the bit line BL is not adjusted to the supply voltage VDD, but is maintained at the ground voltage VSS. In contrast, when the charge trap region CT1 is not programmed, the voltage level of the bit line BL is adjusted to the supply voltage VDD.

Further, as shown in FIG. 3b, if the supply voltage VDD is applied to the first junction region 15a, data stored in the charge trap region CT2 near the second junction region 15b is read as the voltage level of a bit line BL connected to the second junction region 15b, depending on the voltage level of the gate node 11.

As described above, the non-volatile semiconductor memory device, such as NROM, can store data in two charge trap regions, so that it has a degree of integration twice that of a floating gate-type non-volatile semiconductor memory device.

Meanwhile, typical charge trap regions CT1 and CT2 map a bit of data depending on two threshold voltage levels. That is, as shown in FIG. 4, a bit of data is determined by a threshold voltage adjusted to one of two threshold voltage groups. For example, if the threshold voltage of the charge trap regions CT1 and CT2 is lower than a reference voltage VM, the voltage level of a corresponding bit line BL is adjusted to the supply voltage VDD and data "1" is read at the time of reading data. Further, if the threshold voltage of the charge trap regions CT1 and CT2 is higher than the reference voltage VM, the voltage level of a corresponding bit line BL is adjusted to the ground voltage VSS and data "0" is read at the time of reading data.

However, with the high degree of integration of a non-volatile semiconductor memory device, a charge trap-type non-volatile semiconductor memory device having a higher degree of integration is required. That is, a non-volatile semiconductor memory device including two charge trap regions CT1 and CT2, each storing a data value having two or more bits, is required.

SUMMARY OF THE INVENTION

One embodiment of the present invention provides a non-volatile semiconductor memory device. The non-volatile semiconductor memory device of this embodiment includes a memory array including a plurality of memory elements each capable of storing data in at least two charge trap regions depending on the direction of current flow, a page buffer driven to map three data bits to threshold voltage groups of the two charge trap regions, and a row decoder for controlling a word line of a selected memory element of the memory array.

Also provided in the present invention is a method of efficiently driving embodiments of the non-volatile semiconductor memory device including a programming method and a reading method.

DETAILED DESCRIPTION

The above and other objects, features and other advantages of the present invention will be more clearly understood from the following detailed description taken in conjunction with the accompanying drawings. Embodiments of the present invention are described with reference to the attached drawings. In the following detailed description of the present invention, descriptions of elements with well known functions and constructions may be omitted so as not to obscure the inventive principles of this patent disclosure.

Figure 1:
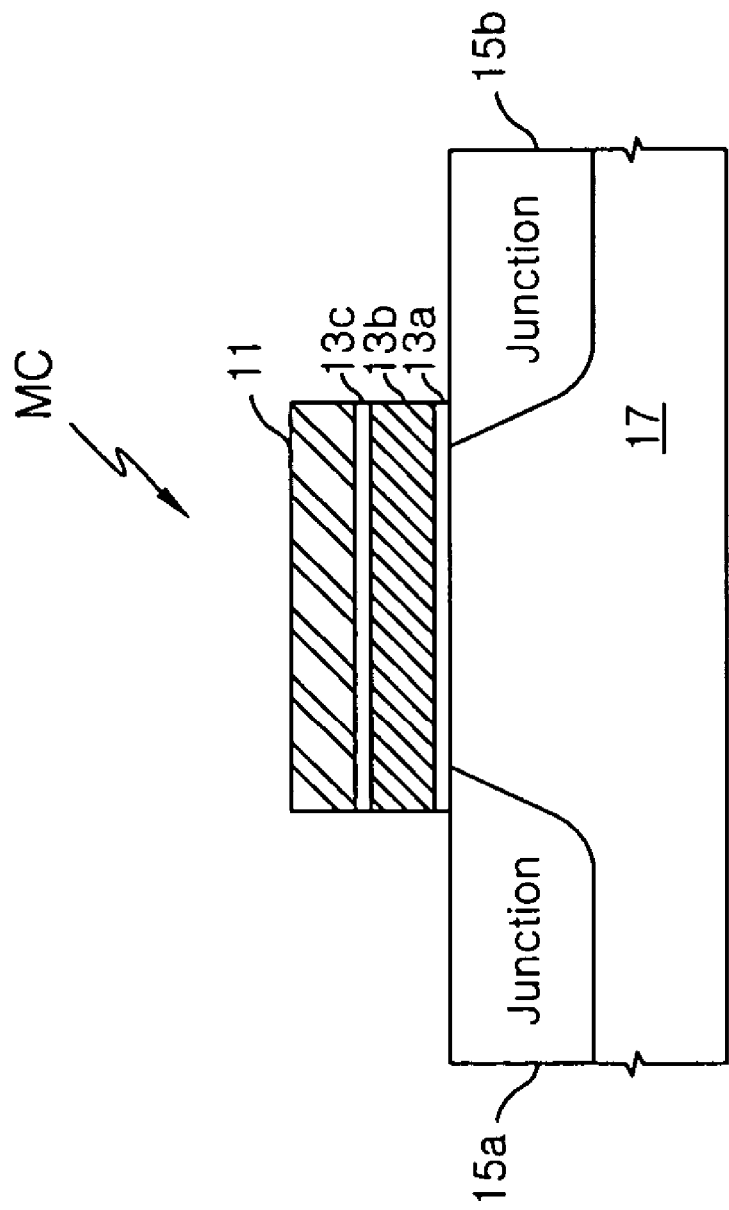
FIG. 1 is a sectional view of a prior art semiconductor device showing a typical charge trap-type memory element.
Figure 2A:
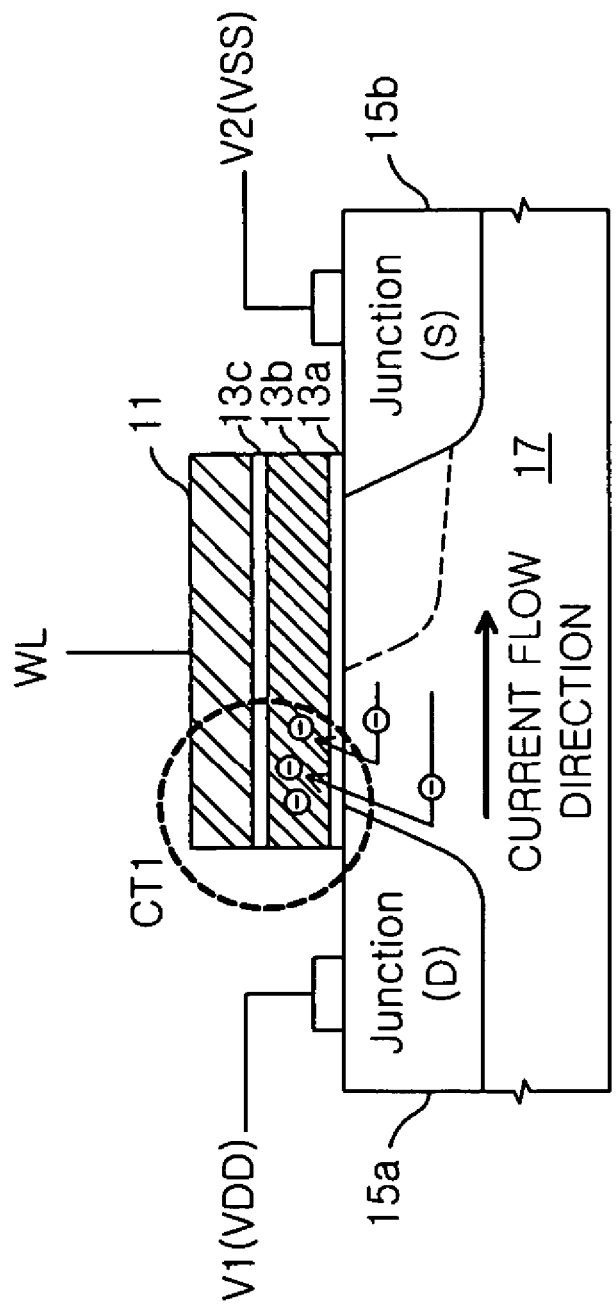
FIGS. 2a and 2b are views of a prior art semiconductor device showing the principle of programming charge trap regions.
Figure 2B:
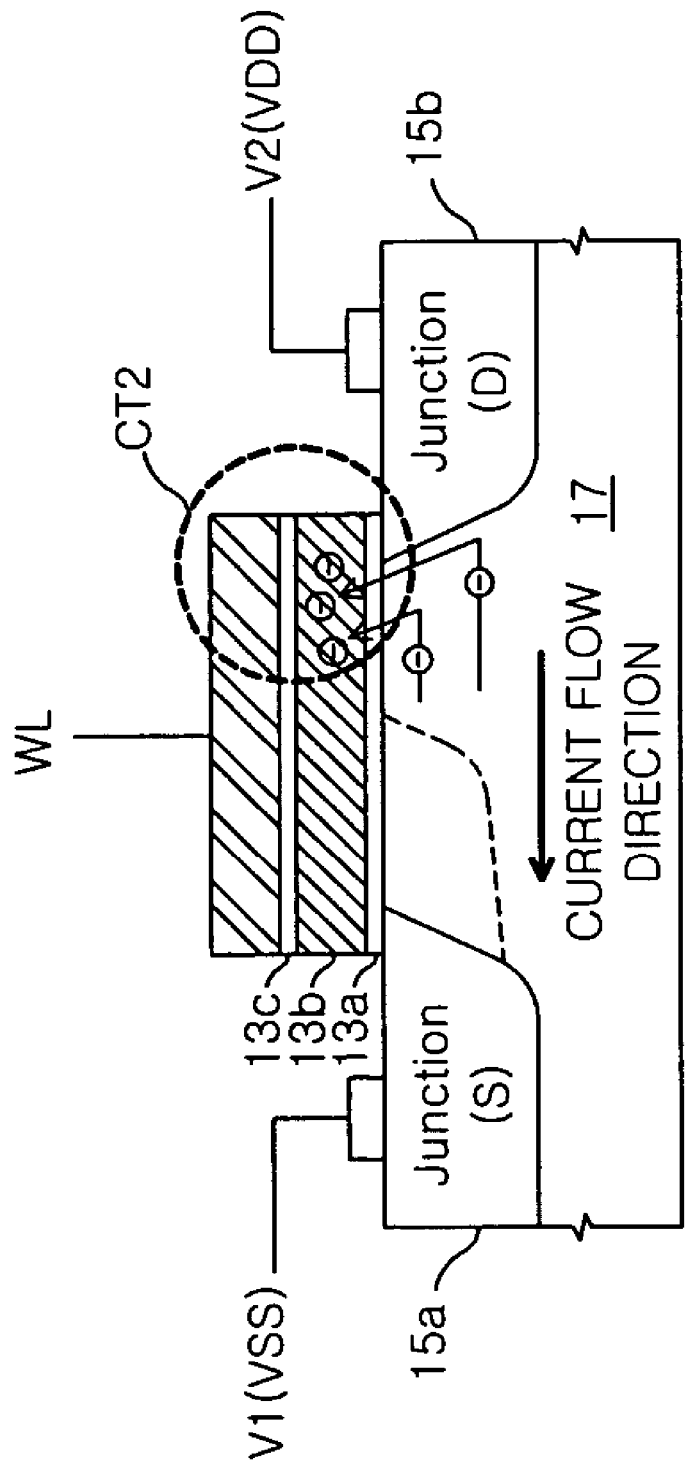
Figure 3A:
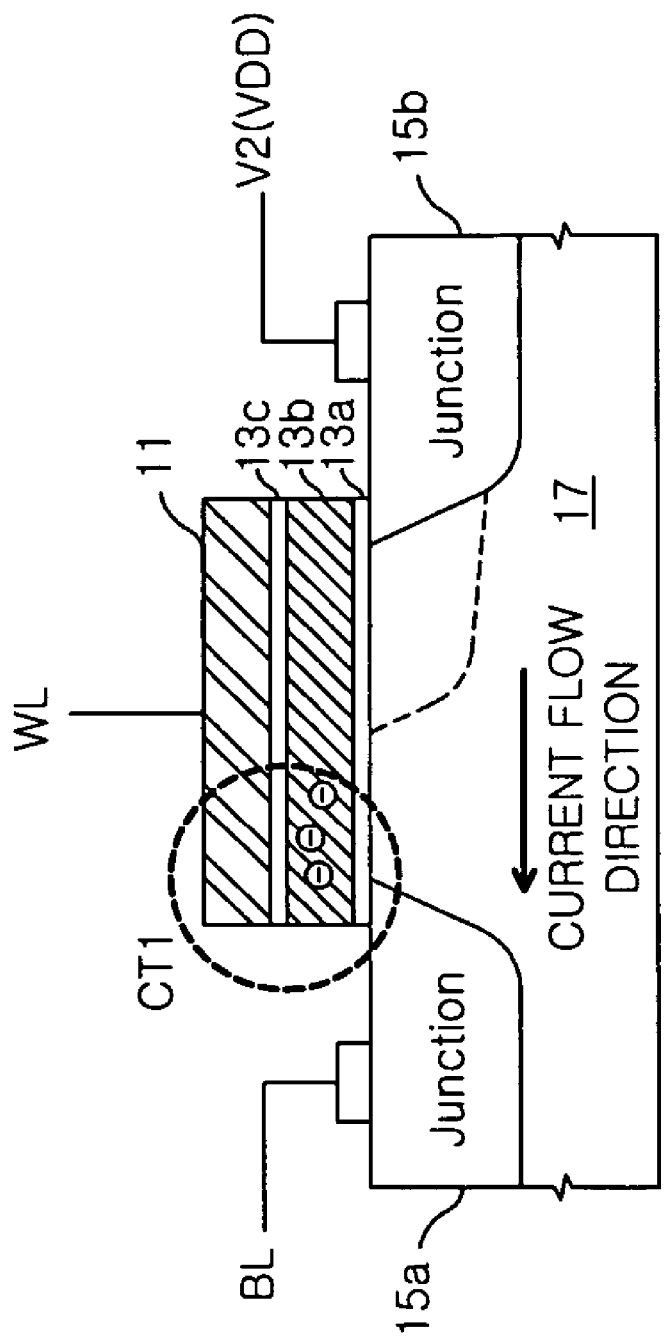
FIGS. 3a and 3b are views of a prior art semiconductor device showing the principle of reading data from charge trap regions.
Figure 3B:
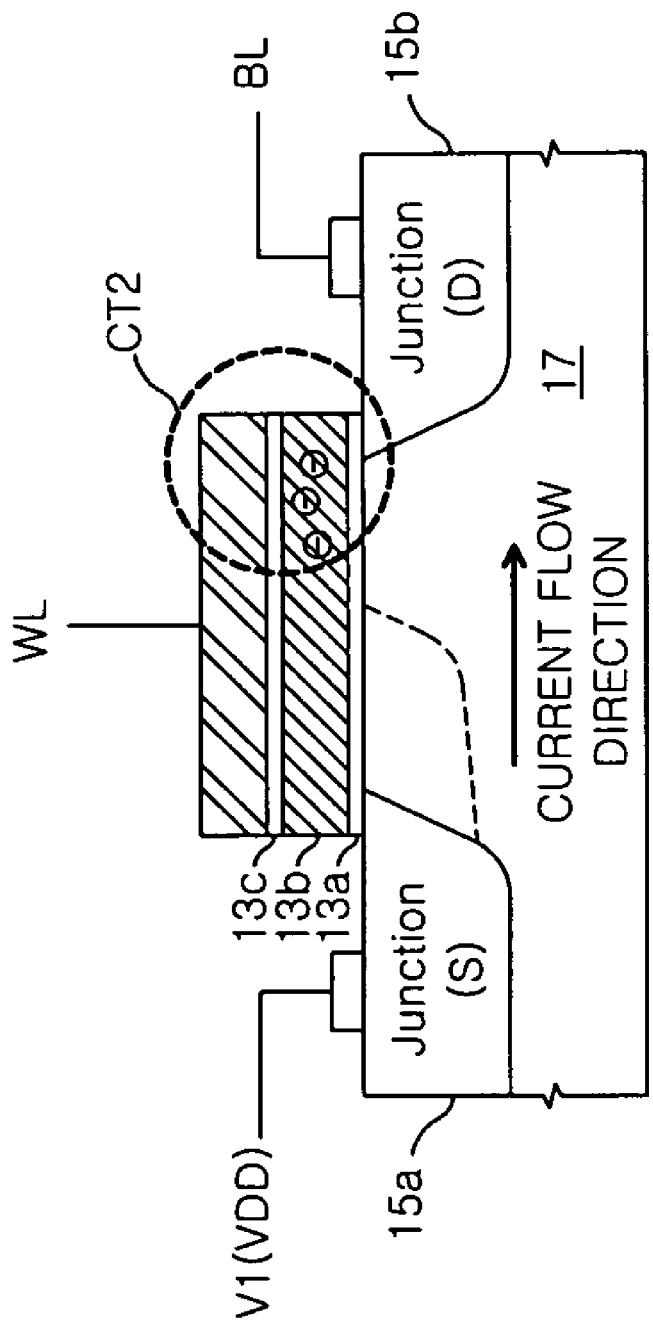
Figure 4:
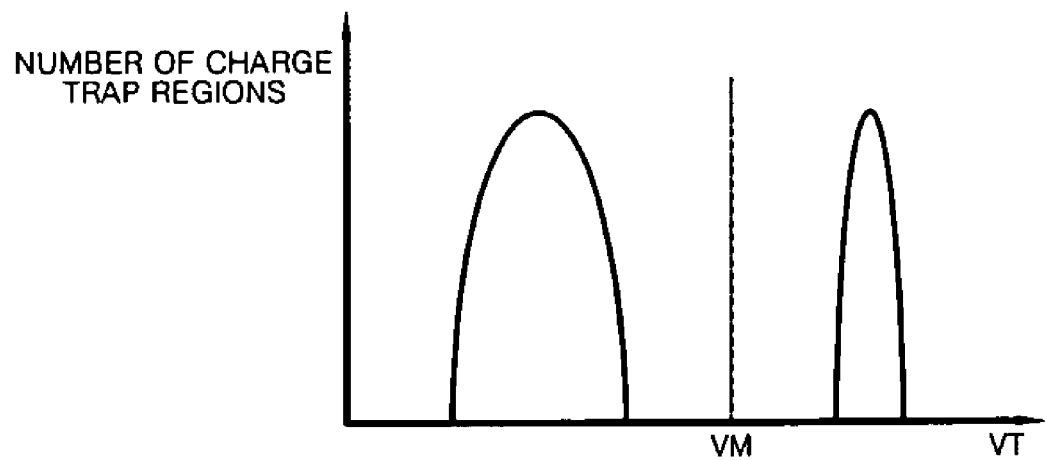
FIG. 4 is a graphical view showing the distribution of threshold voltages of a typical 2-level charge trap region.
Figure 5:
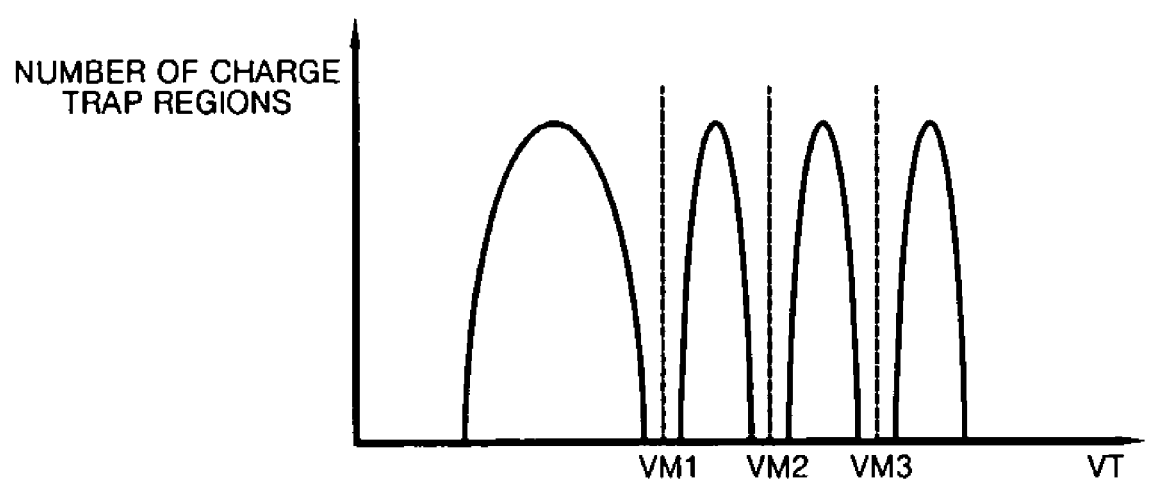
FIG. 5 is a graphical view showing the distribution of threshold voltages of a typical 4-level charge trap region.

FIG. 5 is a graphical view showing the distribution of threshold voltages of a typical 4-level charge trap region. Referring to FIG. 5, one method for improving the degree of integration of a charge trap-type non-volatile semiconductor memory device is a 4-level charge trap region having charge trap regions CT1 and CT2, each programmed to a 4-level threshold voltage group. As shown in FIG. 5, the 4-level charge trap region can be programmed to one of four levels of threshold voltage. Consequently, in the 4-level charge trap region, any one of four types of data can be stored. Therefore, the 4-level charge trap region has data storage capacity about twice that of a 2-level charge trap region.

However, in a 4-level charge trap region, the margin of threshold voltage between adjacent levels is typically very small. Further, the threshold voltage of each charge trap region may be shifted due to the leakage of electrons, etc. This shift may result in a threshold voltage programmed to one of four levels to be shifted to the threshold voltage of an adjacent level. Therefore, in the 4-level charge trap region, reliability may decrease.

Further, since the margin of the threshold voltage between adjacent levels is very low in the 4-level charge trap region, a program voltage applied to the control gate of a memory element is typically increased at small intervals. Therefore, the time required for programming is greatly increased when using a semiconductor device with a 4-level charge trap region configuration.

In order to improve the reliability and required programming time of the 4-level charge trap region, the charge trap-type non-volatile semiconductor memory device of the present invention uses a 3-level charge trap region.

Figure 6:
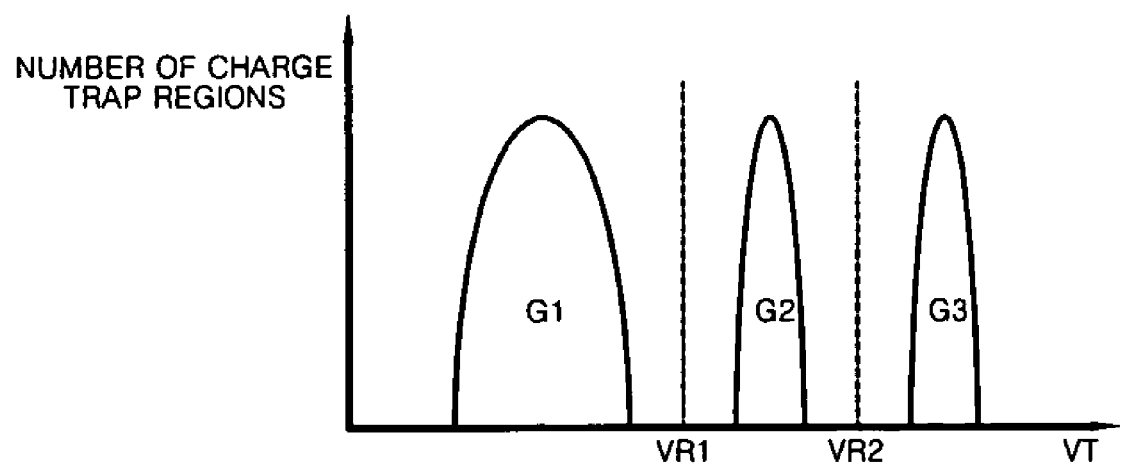
FIG. 6 is a graphical view showing the distribution of threshold voltages of a 3-level charge trap region applied to the present invention.

As shown in FIG. 6, the 3-level charge trap region CT1 or CT2 has three threshold voltage groups G1, G2, and G3. In this case, two charge trap regions CT1 and CT2 form a pair and are operated to store three bits of data.

Accordingly, since the 3-level charge trap region CT1 or CT2 has more data storage states than the 2-level charge trap region CT1 or CT2, the 3-level charge trap region has a higher degree of integration. Further, since the 3-level charge trap region CT1 or CT2 has larger intervals between threshold voltage groups than the 4-level charge trap region, the 3-level charge trap region has better reliability and reduces the time required for programming.

Meanwhile, the threshold voltage groups of the charge trap regions CT1 and CT2 applied to the present invention can be classified based on a first reference voltage VR1 and a second reference voltage VR2. In the present specification, a threshold voltage group having threshold voltages lower than the first reference voltage VR1 is designated as a "first threshold voltage group G1," and a threshold voltage group having threshold voltages between the first reference voltage VR1 and the second reference voltage VR2 is designated as a "second threshold voltage group G2." Further, a threshold voltage group having threshold voltages higher than the second reference voltage VR2 is designated as a "third threshold voltage group G3."

Meanwhile, in the non-volatile semiconductor memory device of the present invention, the first reference voltage VR1 and the second reference voltage VR2 can be set to different levels in a verify read operation of verifying whether programming has succeeded, and in a normal read operation of reading stored data, respectively. In the present embodiment, it is assumed that both the first reference voltage VR1 and the second reference voltage VR2 do not vary in the verify read operation and in the normal read operation. However, other embodiments of this inventive principle may have varying first and second reference voltages.

Figure 7:
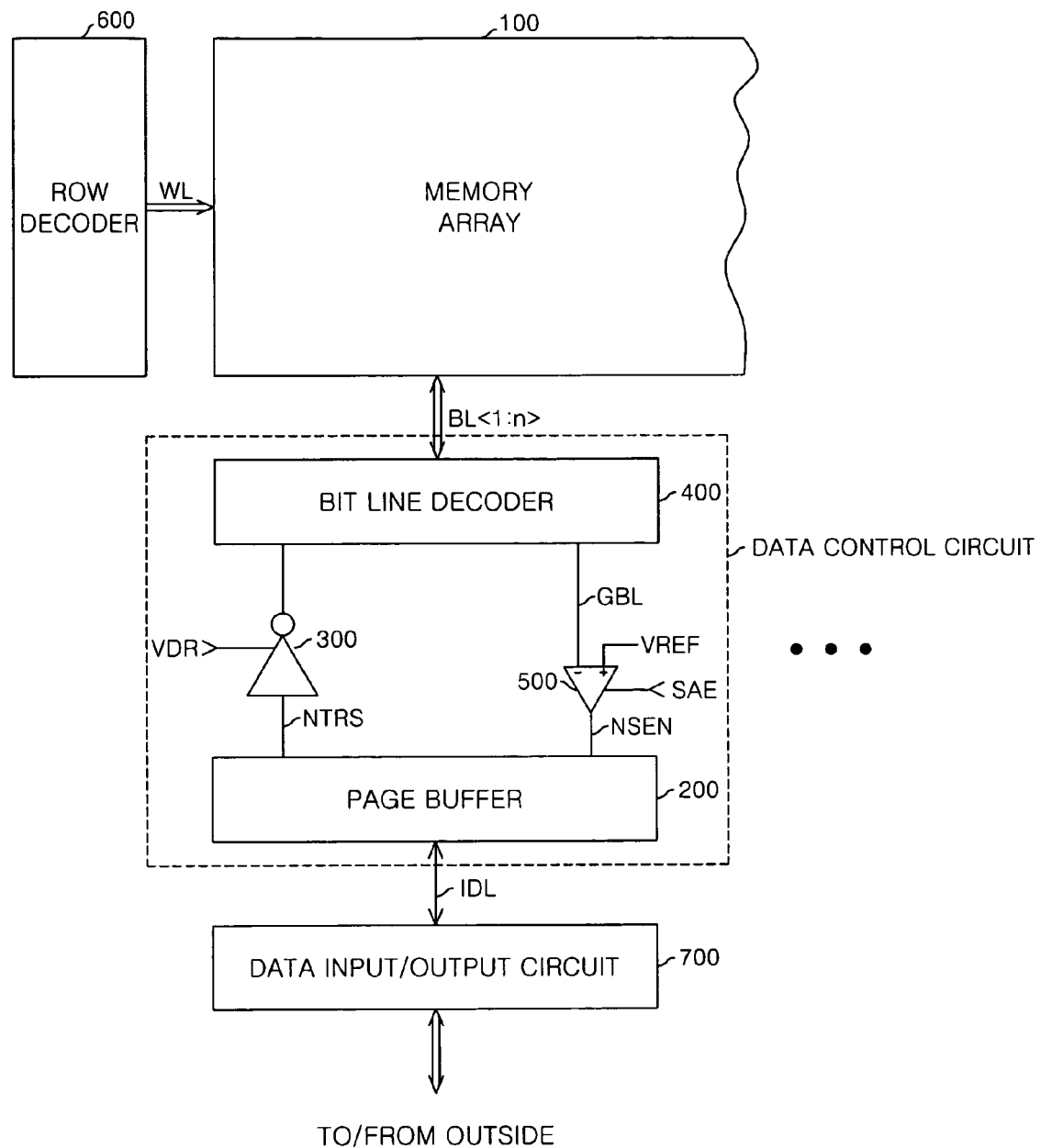
FIG. 7 is a diagram showing part of a non-volatile semiconductor memory device according to an embodiment of the present invention.

FIG. 7 is a diagram showing part of a non-volatile semiconductor memory device according to an embodiment of the present invention. In FIG. 7, a memory array 100, a page buffer 200, a drain voltage supplier 300, a bit line decoder 400, a sense amplifier 500, and a row decoder 600 are shown.

In the present specification, the page buffer 200, the drain voltage supplier 300, the sense amplifier 500, and the bit line decoder 400 can be integrally designated as a "data control circuit." Also shown in FIG. 7, a data input/output circuit 700 is coupled to the page buffer 200.

Figure 8:
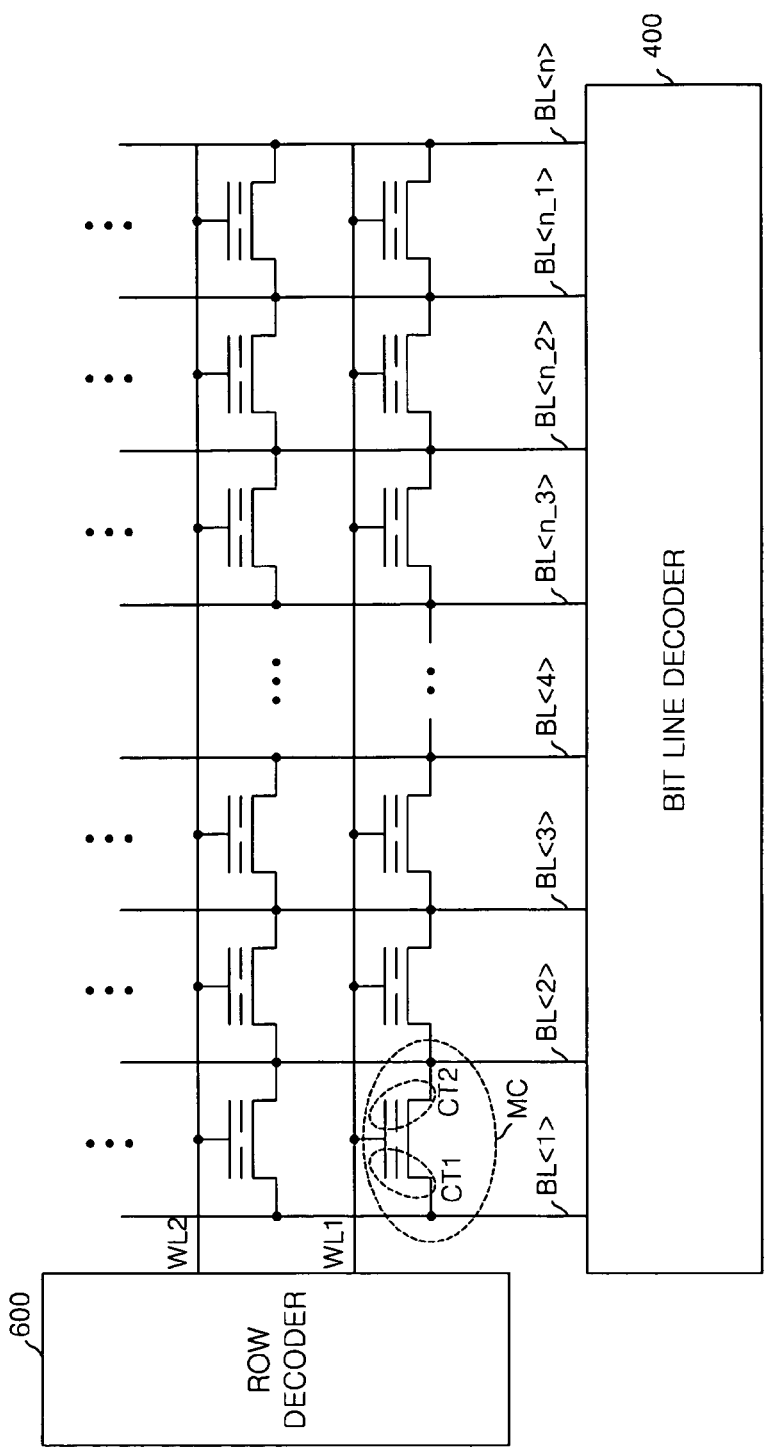
FIG. 8 is a diagram showing part of the memory array of FIG. 7, which shows the memory array of a NOR-type non-volatile semiconductor memory device.

FIG. 8 is a diagram showing part of the memory array 100 of FIG. 7, which shows the memory array of a NOR-type non-volatile semiconductor memory device. The memory array 100 includes a plurality of charge trap-type memory elements MC arranged in a matrix structure of rows and columns. In this case, a single memory element MC includes at least two charge trap regions CT1 and CT2.

The charge trap regions CT1 and CT2 are electrically programmable and erasable, and retain data even if power is not supplied. Further, when the threshold voltage of the charge trap regions CT1 and CT2 is lower than a voltage applied to a gate node, that is, in a "turned on" state, the voltage level of a corresponding bit line BL is adjusted to a supply voltage VDD. Further, when the threshold voltage of the charge trap regions CT1 and CT2 is higher than the voltage applied to the gate node, that is, in a "turned off" state, the voltage level of a corresponding bit line BL is adjusted to a ground voltage VSS.

Meanwhile, in the present embodiment, two charge trap regions CT1 and CT2, formed in one memory element MC, form a pair. However, a pair may also be formed where the two charge trap regions CT1 and CT2 are formed in different memory elements without departing from the technical spirit of the present invention.

In the pair of first and second charge trap regions CT1 and CT2, first to third data bit logic forming a single group can be programmed. Further, storage states according to the threshold voltage of the pair of charge trap regions can be read as the first to third data bits.

In the present specification and drawings, first to third data bits can be denoted by reference characters "BIT1 to BIT3." The page buffer 200 of FIG. 7 is driven to map the first to third data bits BIT1 to BIT3, forming a group, to the threshold voltage groups of the pair of first and second charge trap regions CT1 and CT2. The data programming and reading method using the pair of charge trap regions will be described in detail later.

Figure 9:
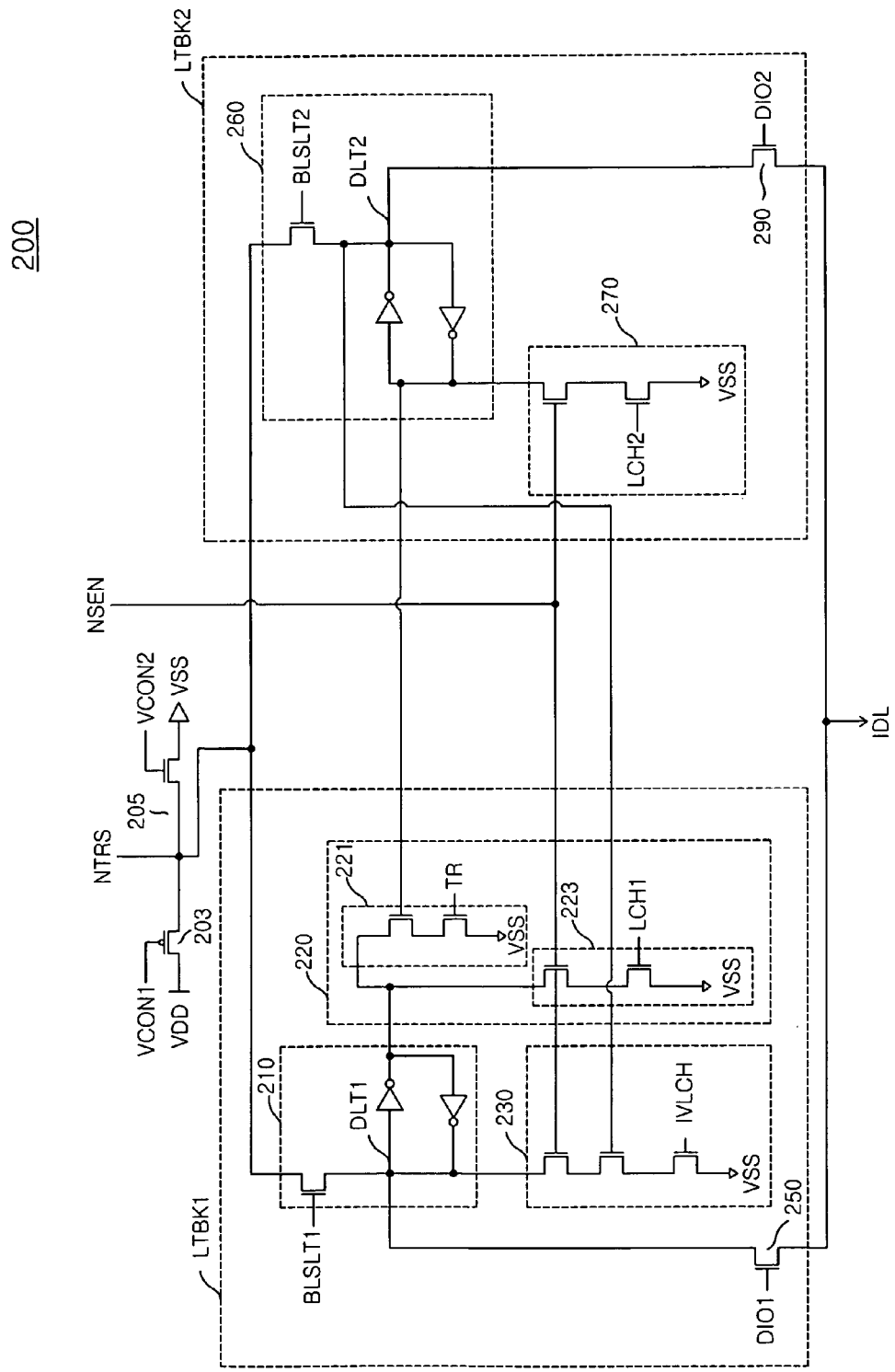
FIG. 9 is a circuit diagram showing the page buffer of FIG. 7.

FIG. 9 is a circuit diagram showing the page buffer 200 of FIG. 7 in detail. The page buffer 200 includes a transmission node NTRS, a sensing node NSEN, a first latch block LTBK1, and a second latch block LTBK2.

The transmission node NTRS can provide data toward the memory array 100. Further, the sensing node NSEN can sense data provided by the memory array 100.

The first latch block LTBK1 can store first latch data DLT1. Further, the first latch block LTBK1 can map the first latch data DLT1 to the transmission node NTRS, and selectively flop the first latch data DLT1 depending on the voltage level of the sensing node NSEN.

The first latch block LTBK1 includes a first latch unit 210, a first flop unit 220 and an inverting flop unit 230.

The first latch unit 210 latches and stores the first latch data DLT1. The first latch unit 210 maps the first latch data DLT1 to the transmission node NTRS in response to a first block selection signal BLSLT1.

The first flop unit 220 is controlled so that the first latch data DLT1 flops from a logic L state to a logic H state depending on the voltage level of the sensing node NSEN or the second latch data DLT2 of the second latch block LTBK2. In the claims of the present specification, a logic L state and a logic H state can be designated as a "first logic state" and a "second logic state," respectively.

The first flop unit 220 includes, in detail, a transmission means 221 and a flop means 223. The transmission means 221 is enabled in response to a transmission control signal TR. In this case, the transmission means 221 flops the first latch data DLT1 from a logic L state to a logic H state depending on the second latch data DLT2 of the second latch block LTBK2.

The flop means 223 is enabled in response to a first latch control signal LCH1. In this case, the flop means 223 performs a control operation so that the first latch data DLT1, latched in the first latch unit 210, flops from a logic L state to a logic H state depending on the voltage level of the sensing node NSEN.

The inverting flop unit 230 is controlled so that the first latch data DLT1, latched in the first latch unit 210, inversely flops from a logic H state to a logic L state depending on the voltage level of the sensing node NSEN and the second latch data DLT2 of the second latch block LTBK2. The inverting flop unit 230 performs a control operation so that the first latch data DLT1 inversely flops depending on the voltage level of the sensing node NSEN. In this case, when the logic state of the second latch data DLT2, latched in the second latch block LTBK2, is logic L, the inverting flop of the first latch data DLT1 from a logic H state to a logic L state by the inverting flop unit 230 is interrupted.

Preferably, the first latch block LTBK1 further includes a first input/output unit 250. The first input/output unit 250 may load the first latch data DLT1 of the first latch unit 210 or may provide the first latch data DLT1 to an internal data line IDL.

The second latch block LTBK2 can store second latch data DLT2. Further, the second latch block LTBK2 can map the second latch data DLT2 to the transmission node NTRS, and selectively flop the second latch data DLT2 depending on the voltage level of the sensing node NSEN.

The second latch block LTBK2 includes a second latch unit 260 and a second flop unit 270. The second latch unit 260 latches and stores the second latch data DLT2. Further, the second latch unit 260 maps the second latch data DLT2 to the transmission node NTRS in response to a second block selection signal BLSLT2.

The second flop unit 270 is controlled so that the second latch data DLT2 flops from a logic L state to a logic H state depending on the voltage level of the sensing node NSEN. The second flop unit 270 is enabled in response to a second latch control signal LCH2. In this case, the second flop unit 270 performs a control operation so that the second latch data DLT2, latched in the second latch unit 260, flops from a logic L state to a logic H state depending on the voltage level of the sensing node NSEN.

In FIG. 9, a transmission node precharge unit 203 precharges the transmission node NTRS to the supply voltage VDD in response to a first control signal VCON1. A transmission node discharge unit 205 discharges the transmission node NTRS to the ground voltage VSS in response to a second control signal VCON2.

Referring to FIG. 7 again, the drain voltage supplier 300 selectively supplies a drain voltage VDR to the bit line decoder 400 depending on the voltage level of the transmission node NTRS that is controlled by the page buffer 200. In this embodiment, the drain voltage VDR is a program voltage VPGM.

Figure 10:
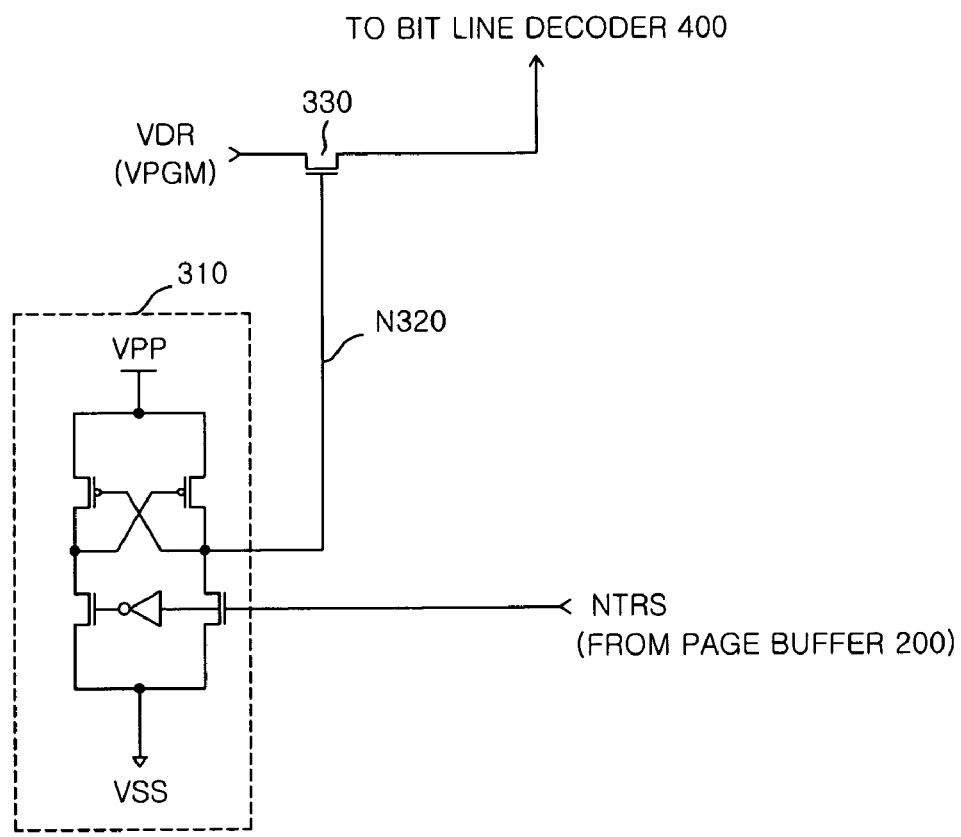
FIG. 10 is a circuit diagram showing the drain voltage supplier of FIG. 7.

FIG. 10 is a circuit diagram showing the drain voltage supplier 300 of FIG. 7 in detail. Referring to FIG. 10, the drain voltage supplier 300 includes an inverting boost unit 310 and a voltage transmission unit 330. The inverting boost unit 310 generates an output signal N320 corresponding to the voltage level of the transmission node NTRS. The output signal N320 of the inverting boost unit 310 is adjusted to a boosted voltage VPP in response to the voltage level of the transmission node NTRS that is adjusted to the ground voltage VSS. Further, the output signal N320 of the inverting boost unit 310 is adjusted to the ground voltage VSS in response to the voltage level of the transmission node NTRS that is adjusted to the supply voltage VDD.

Further, the voltage transmission unit 330 provides the drain voltage VDR to the bit line decoder 400 in response to the voltage level of the output signal N320 of the inverting boost unit 310. Preferably, the drain voltage VDR is a program voltage VPGM.

Consequently, when the voltage level of the transmission node NTRS is adjusted to the ground voltage VSS, that is, when the first and second latch data DLT1 and DLT2 (refer to FIG. 9) in a logic L state are mapped, the drain voltage VDR is provided to the bit line decoder 400. That is, the drain voltage supplier 300 inverts the logic state of the transmission node NTRS, and supplies the inverted logic state to the bit line decoder 400.

Referring to FIG. 7 again, the bit line decoder 400 selects any one of bit lines BL <1:n> of the memory array 100. During a program operation, the voltage level of a selected bit line BL <1:n> is controlled depending on whether the drain voltage VDR is supplied by the drain voltage supplier 300. That is, if the drain voltage VDR is supplied by the drain voltage supplier 300, the voltage level of the selected bit line BL<1:n> is adjusted to the program voltage VPGM. In contrast, if the drain voltage VDR is not supplied by the drain voltage supplier 300, the selected bit line BL <1:n> is floated or adjusted to the ground voltage VSS.

Further, the bit line decoder 400 provides the voltage level of the selected bit line BL<1:n> to a global bit line GBL.

The sense amplifier 500 inverts and amplifies the voltage level of the global bit line GBL, and provides the inverted and amplified voltage level to the sensing node NSEN (refer to FIG. 9) of the page decoder 200.

Figure 11:
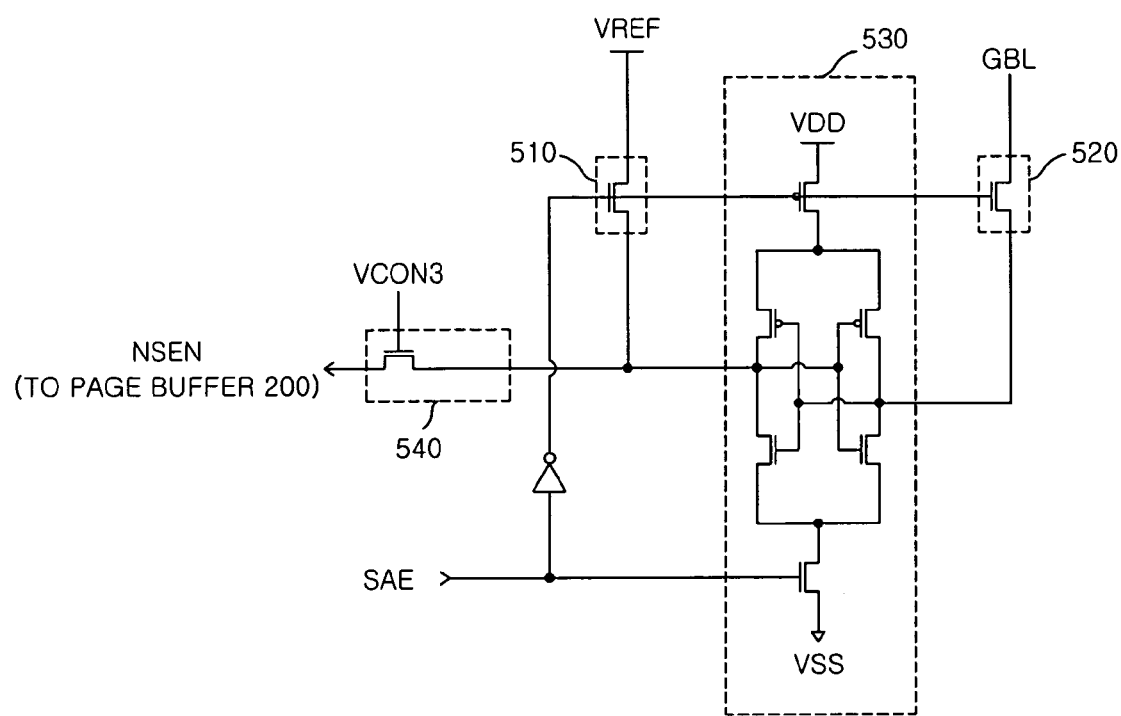
FIG. 11 is a circuit diagram showing the sense amplifier of FIG. 7.

FIG. 11 is a circuit diagram showing the sense amplifier 500 of FIG. 7 in detail. Referring to FIG. 11, the sense amplifier 500 includes sensing units 510 and 520, an amplification unit 530, and a sensing voltage output unit 540. The sensing units 510 and 520 sense a reference voltage VREF and the global bit line GBL, respectively, when a sensing enable signal SAE is inactivated to a logic L state. The amplification unit 530 compares the voltage level of the global bit line GBL, sensed by the sensing unit 510, with the reference voltage VREF and amplifies the compared global bit line voltage.

Further, the sensing voltage output unit 540 inverts the voltage of the global bit line GBL amplified by the amplification unit 530, and provides the inverted voltage to the sensing node NSEN (of FIG. 9) of the page buffer 200.

That is, when the charge trap regions CT1 and CT2 are turned off, the voltage level of the sensing node NSEN is adjusted to the ground voltage VSS. Further, when the charge trap regions CT1 and CT2 are turned on, the voltage level of the sensing node NSEN is adjusted to the supply voltage VDD.

Referring to FIG. 7 again, the row decoder 600 is coupled to the memory array 100 to control the voltage level of a selected word line WL. The data input/output circuit 700 outputs data, latched in the page buffer 200, to an external system, and loads data input from the external system on the page buffer 200.

Meanwhile, in this embodiment, a data value on the internal data line IDL is assumed to be equal to that of each of first to third data bits BIT1 to BIT3, which are provided to the outside of the page buffer at the time of performing a program or read operation. That is, it is assumed that, when each data bit value is "1," the logic level of the internal data line IDL is logic H, while when each data bit value is "0," the logic level of the internal data line IDL is logic L.

In the non-volatile semiconductor memory device of the present invention, each of the charge trap regions CT1 and CT2 stores 1.5 bits of data. That is, a single memory element has charge trap regions for storing 3 bits of data. Therefore, according to the non-volatile semiconductor memory device of the present invention, a degree of integration is remarkably improved.

Next, the programming method for the non-volatile semiconductor memory device of the present invention is described. The programming of a pair of charge trap regions is performed in the sequence of first to third page programming steps that respectively use first to third data bits BIT1 to BIT3.

Figure 12:
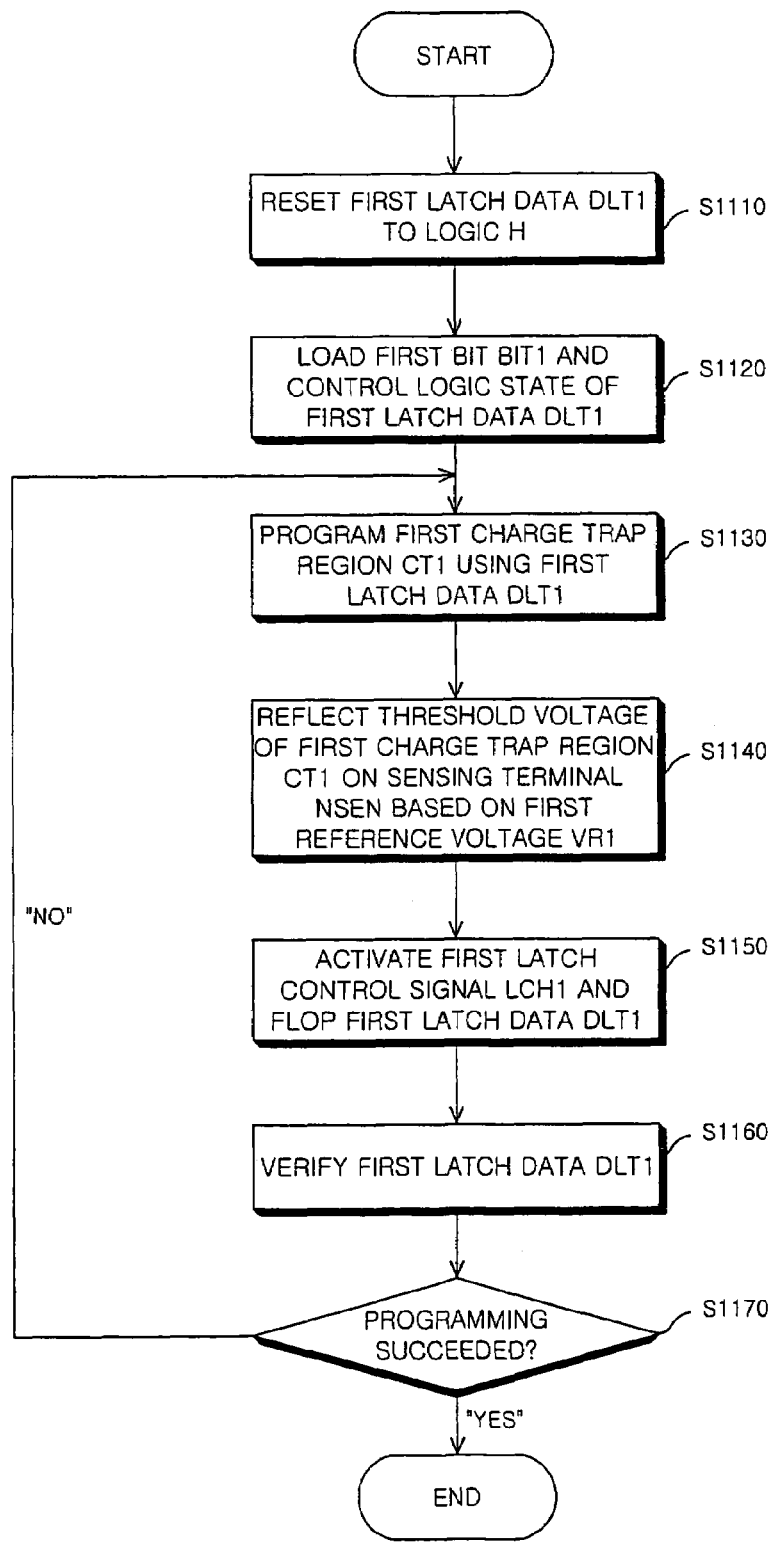
FIGS. 12 and 13 are a flowchart and a data flow diagram, respectively, showing a first page programming step in a programming method for the non-volatile semiconductor memory device according to the present invention.
Figure 13:
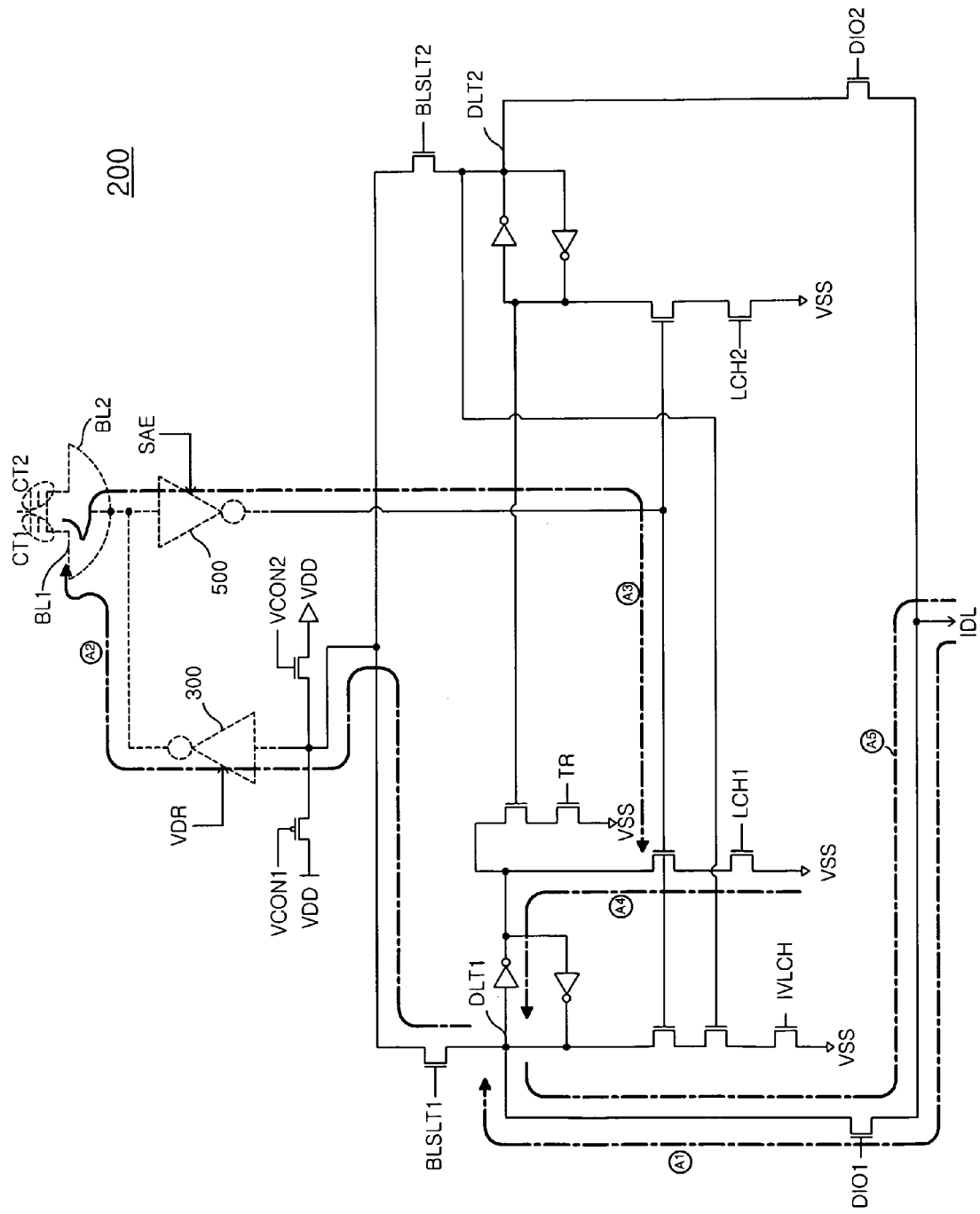

FIGS. 12 and 13 are a flowchart and a data flow diagram, respectively, showing a first page programming step in the programming method for the non-volatile semiconductor memory device according to the present invention. At the first page programming step, the threshold voltage of the first charge trap region CT1 is programmed to the second threshold voltage group G2 depending on the first data bit BIT1.

Referring to FIG. 12, at step S1110, the first latch data DLT1 is reset to a logic H state. At step S1120, the first data bit BIT1 is loaded as the first latch data DLT1 through an internal data line IDL (refer to A1 of FIG. 13). That is, when the first data bit BIT1 is "0," the first latch data DLT1 is latched as a logic L state. In contrast, when the first data bit BIT1 is "1," the first latch data DLT1 is maintained at a logic H state.

Next, at step S1130, the programming of the first charge trap region CT1 is performed using the first latch data DLT1 (refer to A2 of FIG. 13). That is, if the first data bit BIT1 is "0," the threshold voltage of the first charge trap region CT1 increases, while if the first data bit BIT1 is "1," the threshold voltage of the first charge trap region CT1 is maintained at its previous state.

Further, at step S1140, the threshold voltage of the first charge trap region CT1 is reflected on the sensing node NSEN, based on the first reference voltage VR1 (refer to A3 of FIG. 13). That is, whether the threshold voltage of the first charge trap region CT1 is higher than the first reference voltage VR1 is reflected on the sensing node NSEN. In other words, if the threshold voltage of the first charge trap region CT1 is higher than the first reference voltage VR1, the voltage level of the sensing node NSEN is adjusted to the ground voltage VSS. In contrast, if the threshold voltage of the first charge trap region CT1 is lower than the first reference voltage VR1, the voltage level of the sensing node NSEN is adjusted to the supply voltage VDD.

At step S1150, the first latch control signal LCH1 is generated as an H pulse. At this time, the first latch data DLT1 selectively flops from a logic L state to a logic H state depending on the voltage level of the sensing node NSEN (refer to A4 of FIG. 13). In other words, if the voltage level of the sensing node NSEN is adjusted to the supply voltage VDD, the first latch data DLT1 flops from a logic L state to a logic H state. In contrast, if the voltage level of the sensing node NSEN is adjusted to the ground voltage VSS, the first latch data DLT1 is maintained at its previous data state.

Consequently, the fact that the first latch data DLT1 is in a logic L state after step S1150 has been performed, means that, although the programming of the first charge trap region CT1 is performed, the threshold voltage of the first charge trap region CT1 cannot be adjusted to the second threshold voltage group G2 which is the target.

At step S1160, a first data line control signal DIO1 is generated as an H pulse, so that the logic state of the first latch data DLT1 is read out (refer to A5 of FIG. 13). At step S1170, whether programming has succeeded is verified. In this embodiment, the logic H state of data read at step S1160 indicates that programming has succeeded. In contrast, the logic L state of the data read at step S1160 indicates that programming has failed.

If programming has failed, steps starting from step S1130 are repeated. In this case, at step S1130, the voltage level of a selected word line or bit line gradually increases.

Figure 14:
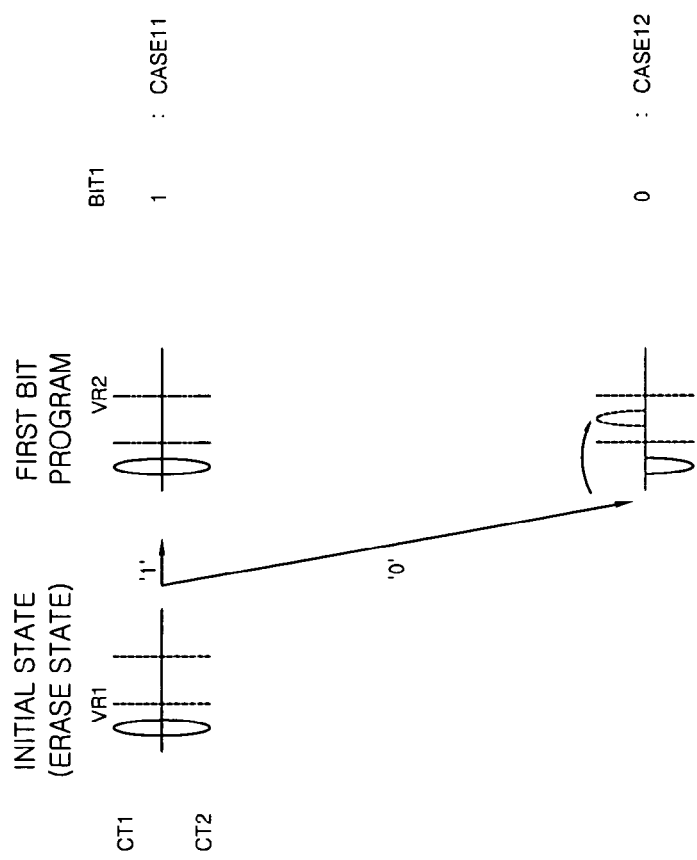
FIG. 14 is a view showing a variation in the threshold voltage of a memory element after the first page programming step has been performed in the programming method for the non-volatile semiconductor memory device according to the present invention.

FIG. 14 is a view showing a variation in the threshold voltages of the first and second charge trap regions CT1 and CT2 after the first page programming step has been performed in the programming method for the non-volatile semiconductor memory device according to the present invention.

When the first data bit BIT1 is "1" (CASE11), all of the threshold voltages of the first and second charge trap regions CT1 and CT2 are maintained at an erase state, that is, at the first threshold voltage group G1.

When the first data bit BIT1 is "0" (CASE12), the threshold voltage of the first charge trap region CT1 is adjusted to the second threshold voltage group G2, and the threshold voltage of the second charge trap region CT2 is maintained at the first threshold voltage group G1.

Figure 15A:
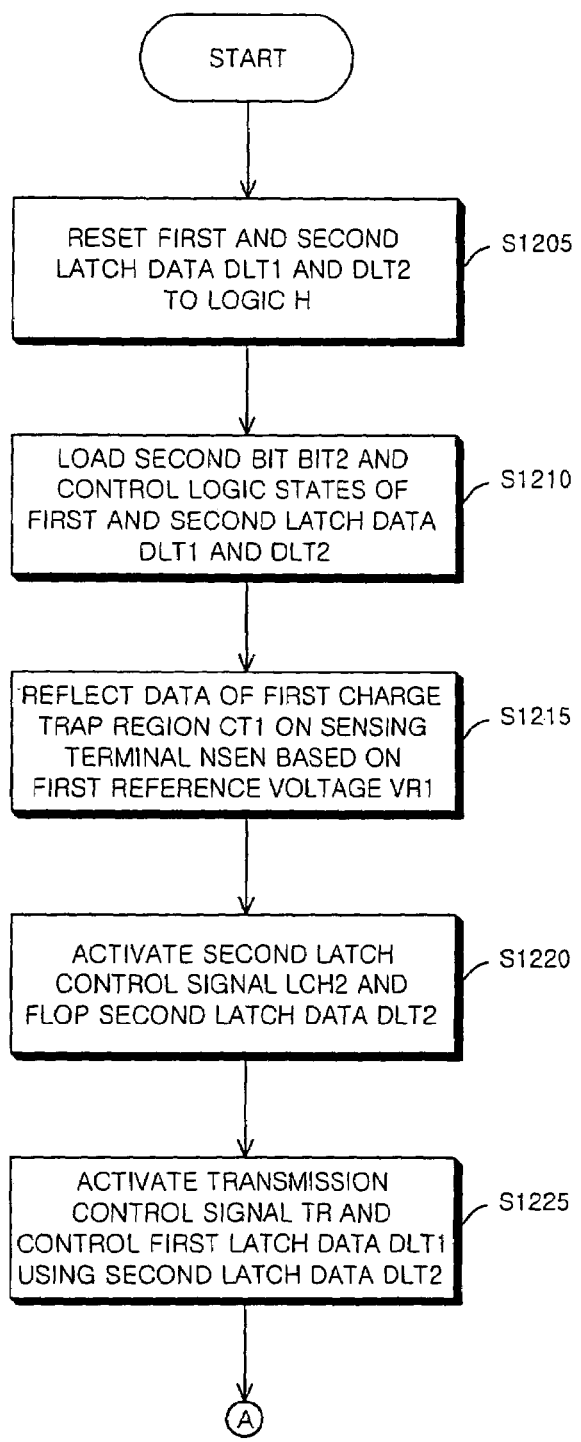
FIGS. 15a and 15b are flowcharts showing a second page programming step in the programming method for the non-volatile semiconductor memory device according to the present invention.
Figure 15B:
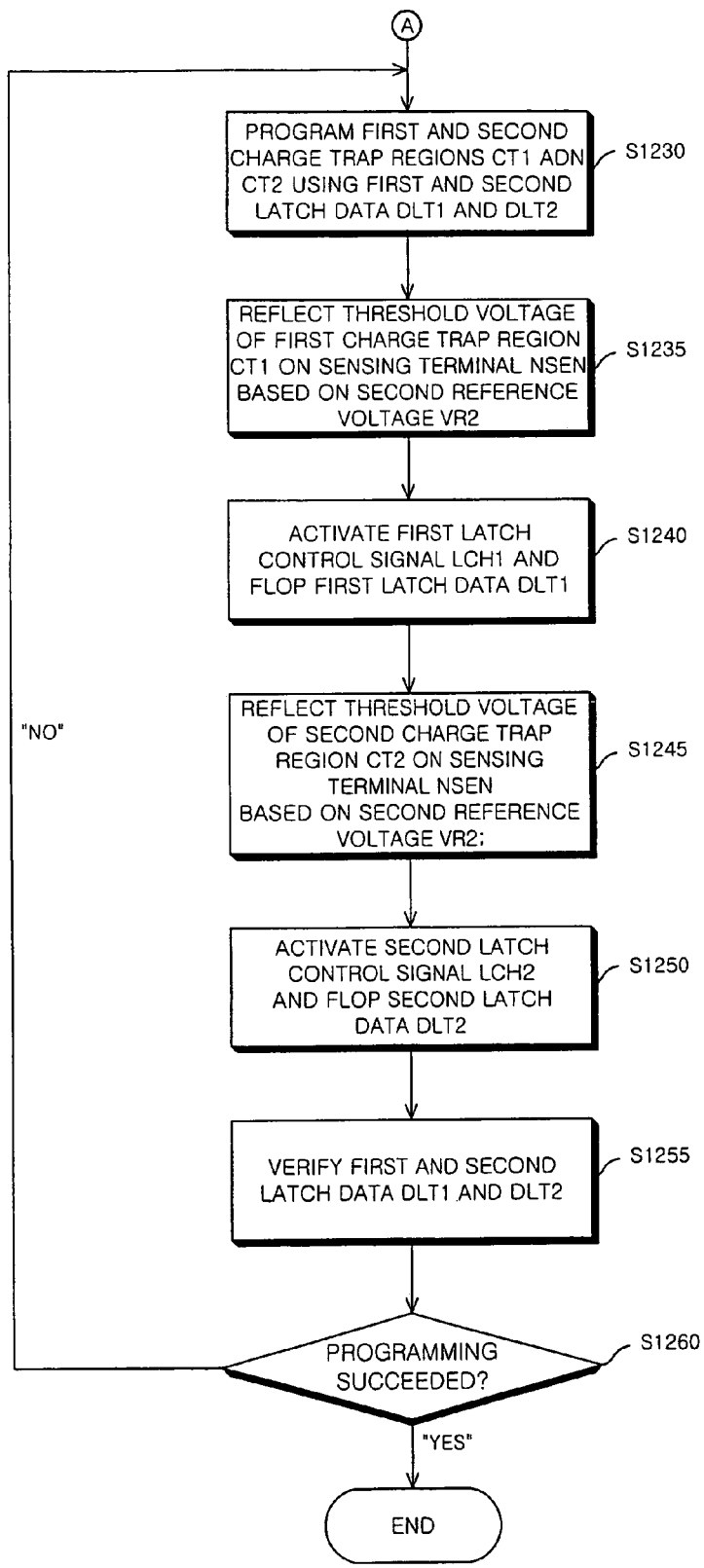
Figure 16A:
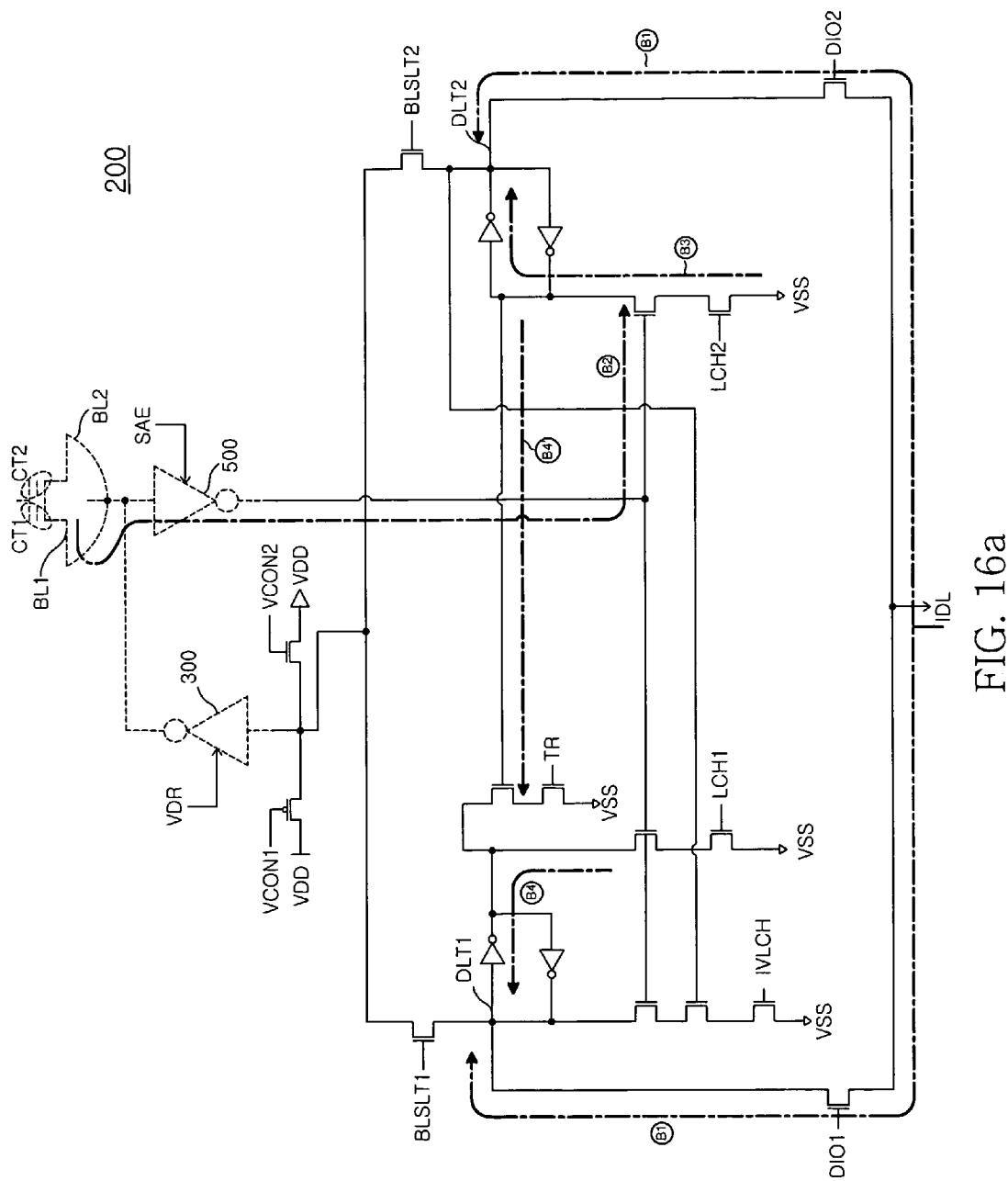
FIGS. 16a and 16b are data flow diagrams based on the flowcharts of FIGS. 15a and 15b.
Figure 16B:
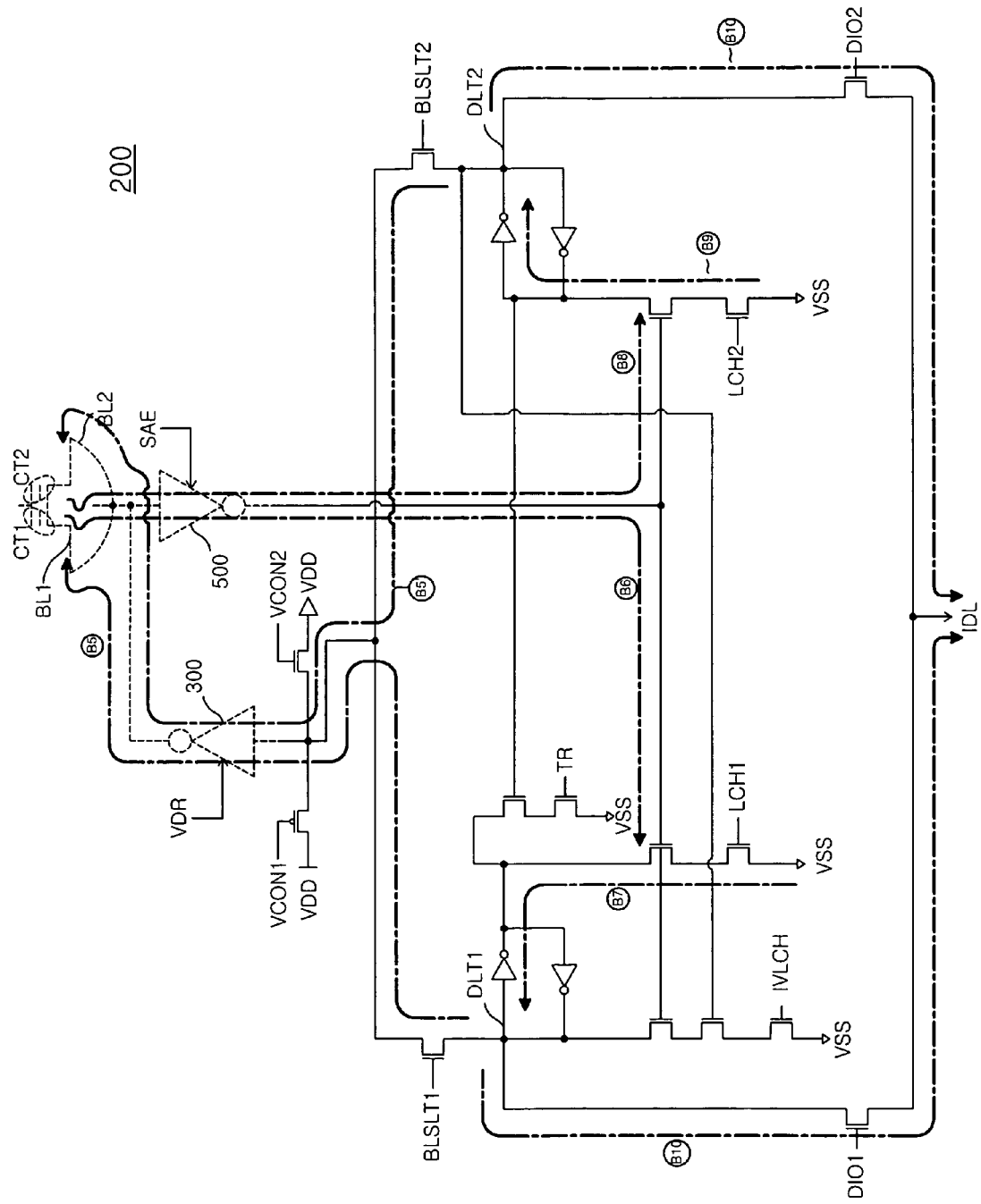

FIGS. 15a and 15b are flowcharts showing a second page programming step in the programming method for the non-volatile semiconductor memory device according to the present invention. Further, FIGS. 16a and 16b are data flow diagrams based on the flowcharts of FIGS. 15a and 15b. At the second page programming step, the threshold voltage of the first charge trap region CT1 or the second charge trap region CT2 is programmed to the third threshold voltage group G3 depending on the second data bit BIT2.

Referring to FIGS. 15a and 15b, at step S1205, the first and second latch data DLT1 and DLT2 are reset to a logic H state. Further, at step S1210, a data loading step of controlling the first and second latch data DLT1 and DLT2 using the second data bit BIT2 through the internal data line IDL is performed (refer to B1 of FIG. 16a). That is, when the second data bit BIT2 is "0," the first and second latch data DLT1 and DLT2 are latched as a logic L state. In contrast, when the second data bit BIT2 is "1," the first and second latch data DLT1 and DLT2 are maintained at a logic H state.

Thereafter, at steps S1215 and S1220, a previous data reflection step of controlling the second latch data DLT2, controlled at the data loading step using the data programmed in the first charge trap region at the first page programming step, is performed.

In detail, at step S1215, the data of the first charge trap region CT1, programmed at the first page programming step, is reflected on the sensing node NSEN, based on the first reference voltage VR1 (refer to B2 of FIG. 16a). Further, at step S1220, the second latch data DLT2 controlled at step S1210 is controlled using the voltage level of the sensing node NSEN obtained at step S1215 (refer to B3 of FIG. 16a). Consequently, if the first data bit BIT1 is "0," the second latch data DLT2 flops to a logic H state. In contrast, if the first data bit BIT1 is "1," the second latch data DLT2 is maintained at its previous state.

Further, at step S1225, the transmission control signal TR is activated to a logic H state. Therefore, at step S1225, a transmission step of controlling the first latch data DLT1, controlled at step S1210, using the second latch data DLT2, controlled at step S1220, is performed (refer to B4 and B4' of FIG. 16a). That is, if the first data bit BIT1 is "0," the first latch data DLT1 is maintained at its previous state. In contrast, if the first data bit BIT1 is "1," the first latch data DLT1 flops to a logic L state.

After step S1225 has been performed, the logic states of the first latch data DLT1 and the second latch data DLT2 are described below.

That is, if the second data bit BIT2 is "1," the first and second latch data DLT1 and DLT2 are logic H regardless of the value of the first data bit BIT1. If the first data bit BIT1 is "0" and the second data bit BIT2 is "0," the first latch data DLT1 is logic L and the second latch data DLT2 is logic H. If, however, the first data bit BIT1 is "1" and the second data bit BIT2 is "0," the first latch data DLT1 is logic H, and the second latch data DLT2 is logic L.

Thereafter, at step S1230, programming the first and second charge trap regions CT1 and CT2 using the first and second latch data DLT1 and DLT2, controlled at steps S1220 and S1225, is performed (refer to B5 and B5' of FIG. 16b). That is, if the second data bit BIT2 is "1," the threshold voltage of the first charge trap region CT1 is maintained at its previous state. At this time, the programming of the first and second charge trap regions CT1 and CT2 is preferably sequentially performed.

Meanwhile, if the second data bit BIT2 is "0," the threshold voltage of the first or second charge trap region CT1 or CT2 is adjusted to the third threshold voltage group G3. In other words, if the first data bit BIT1 is "0," the threshold voltage of the first charge trap region CT1 is adjusted to the third threshold voltage group G3. If the first data bit BIT1 is "1," the threshold voltage of the second charge trap region CT2 is adjusted to the third threshold voltage group G3.

Consequently, when the threshold voltage of the first charge trap region CT1 has been adjusted to the second threshold voltage group G2 as a result of the first page programming step, the threshold voltage of the first charge trap region CT1 is adjusted to the third threshold voltage group G3 at the second page programming step. In contrast, when the threshold voltage of the first charge trap region CT1 has been maintained at the first threshold voltage group G1 as a result of the first page programming step, the threshold voltage of the second charge trap region CT2 is adjusted to the third threshold voltage group G3 at the second page programming step.

Next, at step S1235, the threshold voltage of the first charge trap region CT1 is reflected on the sensing node NSEN, based on the second reference voltage VR2 (refer to B6 of FIG. 16b). That is, whether the threshold voltage of the first charge trap region CT1 is higher than the second reference voltage VR2 is reflected on the sensing node NSEN.

At step S1240, the first latch control signal LCH1 is generated as an H pulse. In this case, the first latch data DLT1 selectively flops from a logic L state to a logic H state depending on the voltage level of the sensing node NSEN (refer to B7 of FIG. 16b).

Further, at step S1245, the threshold voltage of the second charge trap region CT2 is reflected on the sensing node NSEN, based on the second reference voltage VR2 (refer to B8 of FIG. 16b). That is, whether the threshold voltage of the second charge trap region CT2 is higher than the second reference voltage VR2 is reflected on the sensing node NSEN.

At step S1250, the second latch control signal LCH2 is generated as an H pulse. In this case, the second latch data DLT2 selectively flops from a logic L state to a logic H state depending on the voltage level of the sensing node NSEN (refer to B9 of FIG. 16b).

At step S1255, a first data line control signal DIO1 and a second data line control signal DIO2 are simultaneously or sequentially generated as H pulses, and the logic states of the first and second latch data DLT1 and DLT2 are read out (refer to B10 of FIG. 16b). At step S1260, it is verified whether the above programming has succeeded.

There are multiple circuits known in the art that would work as a program verify circuit for verifying whether programming ahs succeeded at step S1260. This program verify circuit includes the capability of verifying that programming has succeeded if the threshold voltage of any one of the first an second charge trap regions CT1 and CT2 is adjusted to the third threshold voltage group G3. If programming has failed, the process may be repeated from step S1230. At this time, at step S1230, the voltage level of a selected word line or bit line is gradually increased Meanwhile, variations in the voltage level of the sensing node NSEN and the logic states of the first and second latch data DLT1 and DLT2 at steps S1235, S1240, S1245, and S1250 of FIG. 15b will be apparent to those skilled in the art when referring to steps S1140 and S1150 of FIG. 12, so that the detailed descriptions thereof are omitted.

Figure 17:
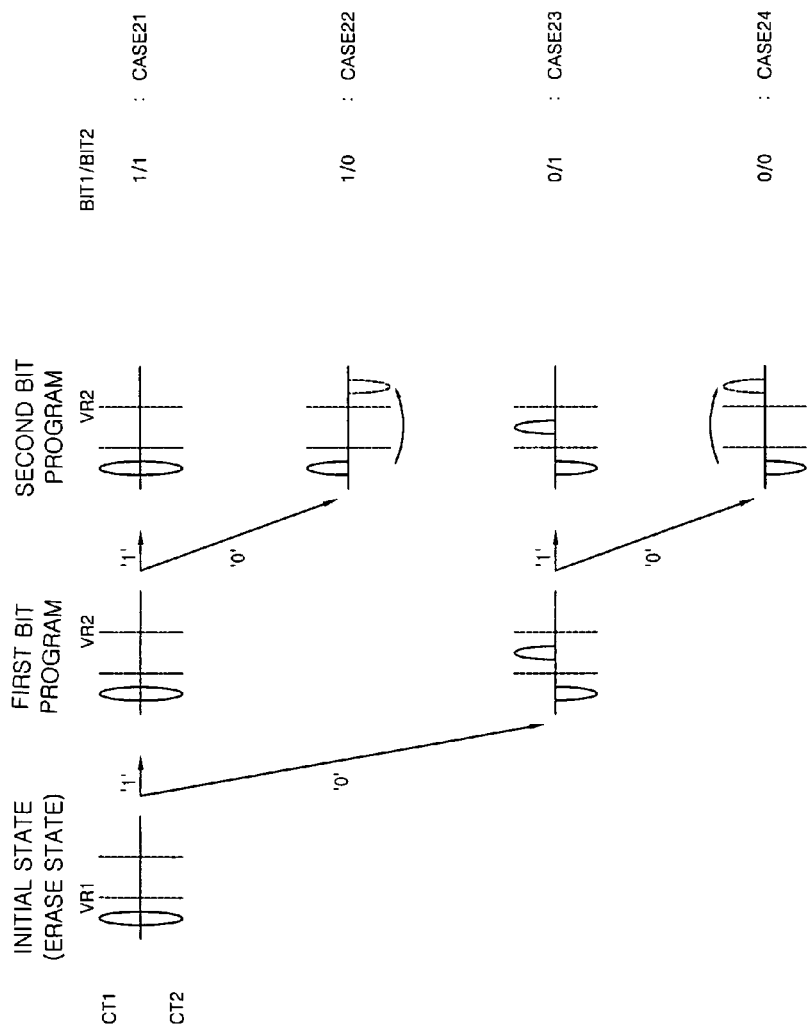
FIG. 17 is a view showing a variation in the threshold voltage of a memory element after the second page programming step has been performed in the programming method for the non-volatile semiconductor memory device according to the present invention.

FIG. 17 is a view showing a riation in the threshold voltages of the first and second charge trap regions CT1 and CT2 after the second page programming step has been performed in the programming method for the non-volatile semiconductor memory device according to the present invention.

When both the first and second data bits BIT1 and BIT2 are "1" (CASE21), the threshold voltages of the first and second charge trap regions CT1 and CT2 are maintained at an erase state, that is, at the first threshold voltage group G1.

When the first data bit BIT1 is "1," and the second data bit BIT2 is "0" (CASE22), the threshold voltage of the first charge trap region CT1 is maintained at the first threshold voltage group G1, and the threshold voltage of the second charge trap region CT2 is adjusted to the third threshold voltage group G3.

When the first data bit BIT1 is "0" and the second data bit BIT2 is "1" (CASE23), the threshold voltage of the first charge trap region CT1 is maintained at the second threshold voltage group G2, and the threshold voltage of the second charge trap region CT2 is maintained at the first threshold voltage group G1.

When both the first data bit BIT1 and the second data bit BIT2 are "0" (CASE24), the threshold voltage of the first charge trap region CT1 is adjusted to the third threshold voltage group G3, and the threshold voltage of the second charge trap region CT2 is maintained at the first threshold voltage group G1.

Figure 18A:
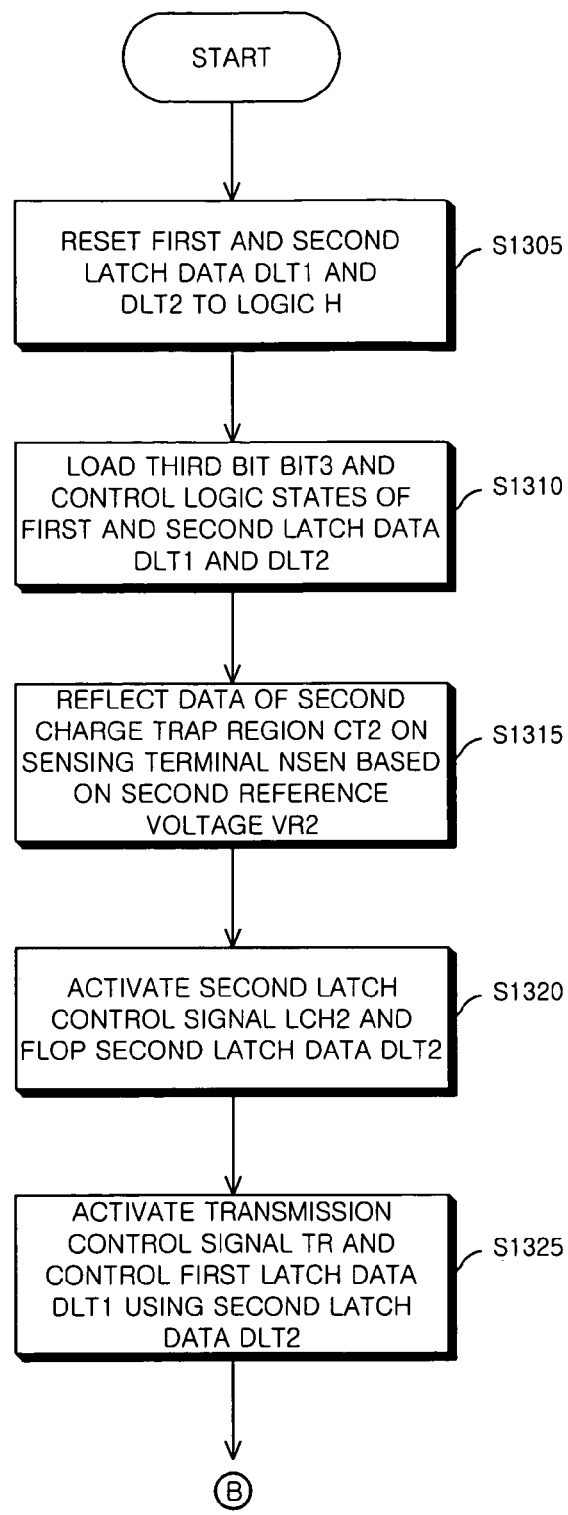
FIGS. 18a and 18b are flowcharts showing a third page programming step in the programming method for the non-volatile semiconductor memory device according to the present invention.
Figure 18B:
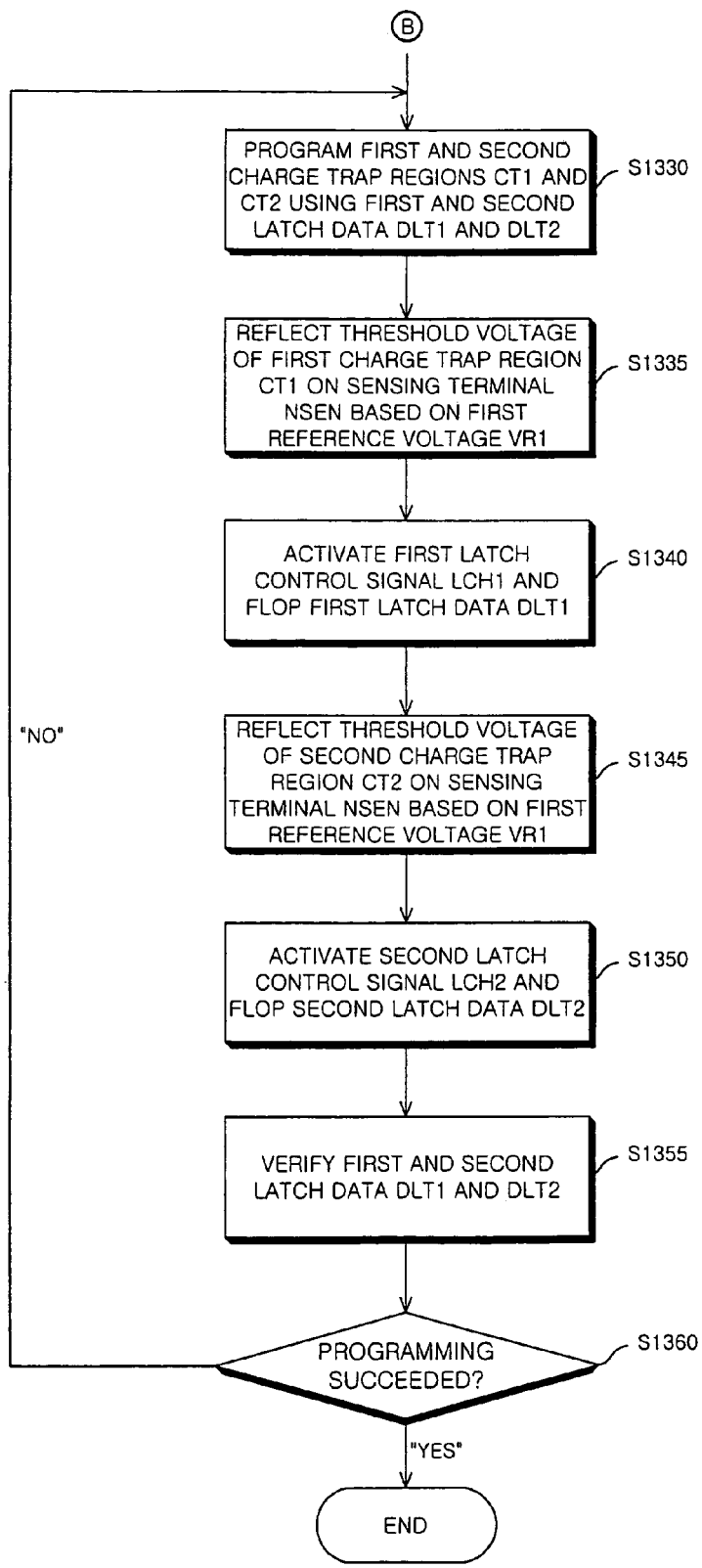
Figure 19A:
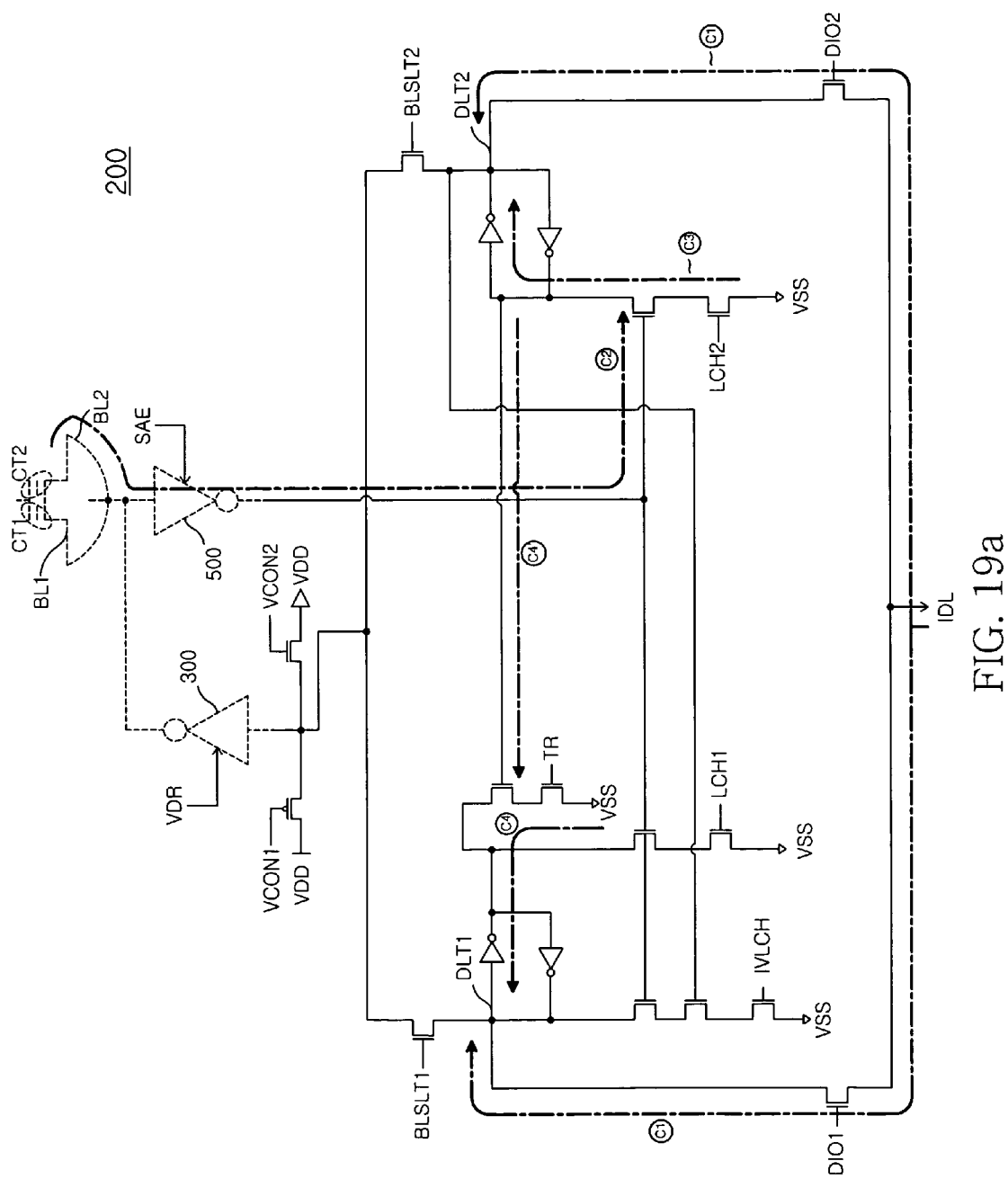
FIGS. 19a and 19b are data flow diagrams based on the flowcharts of FIGS. 18a and 18b.
Figure 19B:
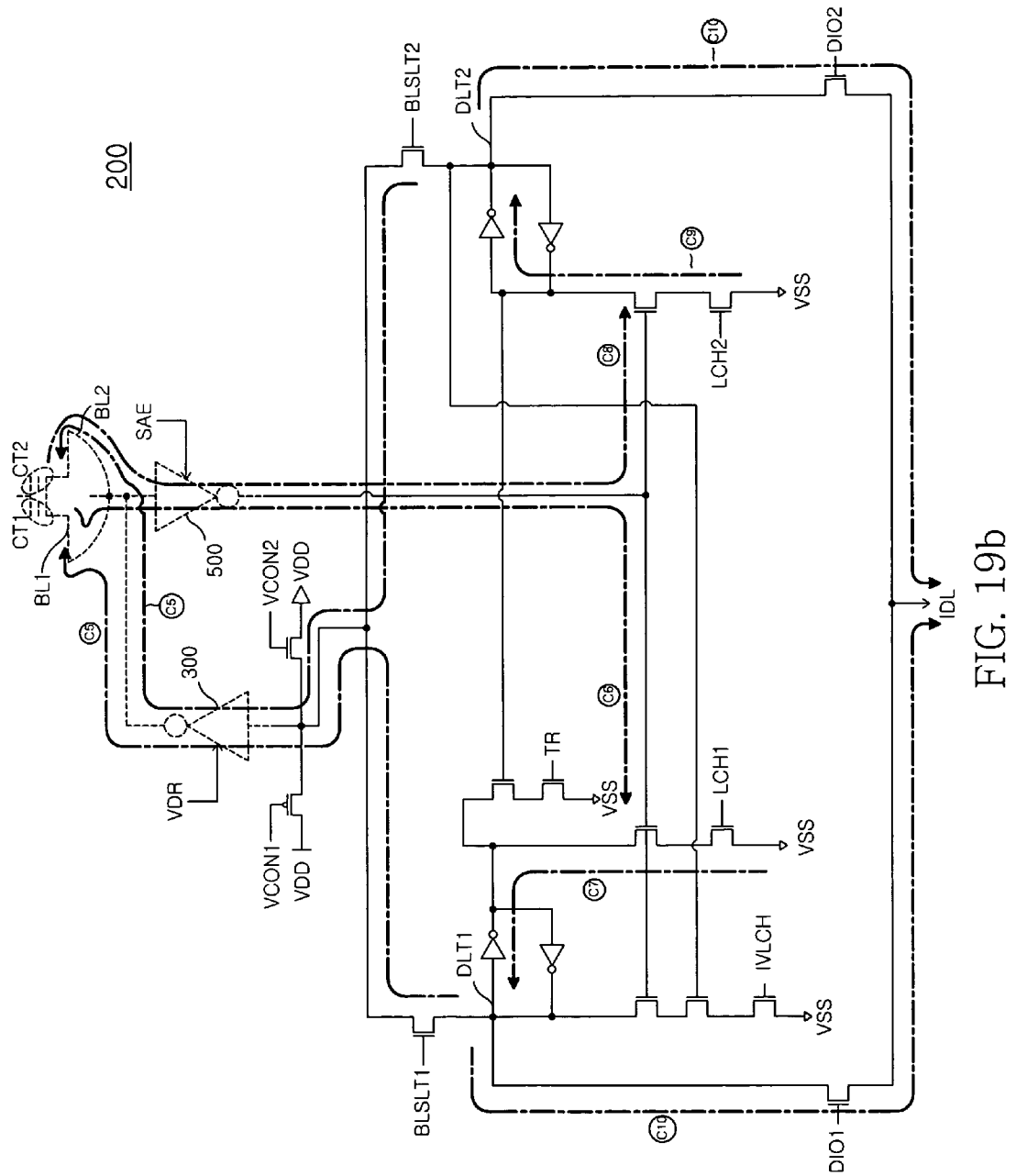

FIGS. 18a and 18b are flowcharts showing a third page programming step in the programming method for the non-volatile semiconductor memory device according to the present invention. FIGS. 19a and 19b are data flow diagrams based on the flowcharts of FIGS. 18a and 18b. At the third page programming step, the threshold voltage of the first or second charge trap region CT1 or CT2 is programmed to the second threshold voltage group G2 depending on the third data bit BIT3.

Referring to FIGS. 18a and 18b, at step S1305, first and second latch data DLT1 and DLT2 are reset to a logic H state. Further, at step S1310, a data loading step of controlling the first and second latch data DLT1 and DLT2 using the third data bit BIT3 through the internal data line IDL, is performed (refer to C1 of FIG. 19a). That is, when the third data bit BIT3 is "0," the first and second latch data DLT1 and DLT2 are latched as a logic L state. In contrast, when the third data bit BIT3 is "1," the first and second latch data DLT1 and DLT2 are maintained at a logic H state.

Next, at steps S1315 and S1320, a previous data reflection step of controlling the second latch data DLT2, controlled at the data loading step using the data programmed in the second charge trap region CT2 at the second page programming step, is performed.

In detail, at step S1315, the data of the second charge trap region CT2, programmed at the second page programming step, is reflected on the sensing node NSEN, based on the second reference voltage VR2 (refer to C2 of FIG. 19a). Further, at step S1320, the second latch data DLT2, controlled at step S1310, is controlled using the voltage level of the sensing node NSEN obtained at step S1315 (refer to C3 of FIG. 19a). Consequently, when the first data bit BIT1 is "1" and the second data bit BIT2 is "0," the second latch data DLT2 flops to a logic H state. In contrast, in the remaining cases except for the case where the first data bit BIT1 is "1," and the second data bit BIT2 is "0," the second latch data DLT2 is maintained at its previous state.

Further, at step S1325, the transmission control signal TR is activated to a logic H state. Therefore, at step S1325, a transmission step of controlling the first latch data DLT1, controlled at step S1310, using the second latch data DLT2 controlled at step S1320, is performed (refer to C4 and C4' of FIG. 19a). That is, when the first data bit BIT1 is "1" and the second data bit BIT2 is "0," the first latch data DLT1 is maintained at its previous state.

In contrast, in the remaining cases except for the case where the first data bit BIT1 is "1" and the second data bit BIT2 is "0," the first latch data DLT1 flops to a logic H state.

The logic states of the first latch data DLT1 and the second latch data DLT2 after step S1325 has been performed are described below.

That is, when the third data bit BIT3 is "1," the first latch data DLT1 and the second latch data DLT2 are logic H regardless of the values of the first and second data bits BIT1 and BIT2. When the first and second data bits BIT1 and BIT2 are "0" and the third data bit BIT3 is "0," the first latch data DLT1 is logic H, and the second latch data DLT2 is logic L. When the first data bit BIT1 is "1" and the second and third data bits BIT2 and BIT3 are "0," the first latch data DLT1 is logic L, and the second latch data DLT2 is logic H. When the first data bit BIT1 is "0," the second data bit BIT2 is "1" and the third data bit BIT3 is "0," the first latch data DLT1 is logic H and the second latch data DLT2 is logic L. Moreover, when the first to third data bits BIT1 to BIT3 are "0," the first latch data DLT1 is logic H and the second latch data DLT2 is logic L.

Thereafter, at step S1330, programming the first and second charge trap regions CT1 and CT2 using the first and second latch data DLT1 and DLT2, controlled at steps S1320 and S1325, is performed (refer to C5 and C5' of FIG. 19b). Preferably, the programming of the first and second charge trap regions CT1 and CT2 is sequentially performed.

When the third data bit BIT3 is "1," the threshold voltage of the first charge trap region CT1 is maintained at its previous state.

In contrast, when the third data bits BIT3 is "0," the threshold voltage of the first charge trap region CT1 or the second charge trap region CT2 is adjusted to the second threshold voltage group G2. In other words, when the first data bit BIT1 is "1" and the second data bit BIT2 is "0," the threshold voltage of the first charge trap region CT1 is adjusted to the second threshold voltage group G2. In the remaining cases except for the case where the first data bit BIT1 is "1" and the second data bit BIT2 is "0," the threshold voltage of the second charge trap region CT2 is adjusted to the second threshold voltage group G2.

Consequently, when the threshold voltage of the second charge trap region CT2 has been adjusted to the third threshold voltage group G3 as a result of the second page programming step, the threshold voltage of the first charge trap region CT1 is adjusted to the second threshold voltage group G2 at the third page programming step. In contrast, when the threshold voltage of the second charge trap region CT2 has been maintained at the first threshold voltage group G1 as a result of the second page programming step, the threshold voltage of the second charge trap region CT2 is adjusted to the second threshold voltage group G2 at the third page programming step.

Next, at step S1335, the threshold voltage of the first charge trap region CT1 is reflected on the sensing node NSEN, based on the first reference voltage VR1 (refer to C6 of FIG. 19b).

At step S1340, the first latch control signal LCH1 is generated as an H pulse. In this case, the first latch data DLT1 selectively flops from a logic L state to a logic H state depending on the voltage level of the sensing node NSEN (refer to C7 of FIG. 19b).

Further, at step S1345, the threshold voltage of the second charge trap region CT2 is reflected on the sensing node NSEN, based on the first reference voltage VR1 (refer to C8 of FIG. 19b).

At step S1350, the second latch control signal LCH2 is generated as an H pulse. In this case, the second latch data DLT2 selectively flops from a logic L state to a logic H state depending on the voltage level of the sensing node NSEN (refer to C9 of FIG. 19b).

At step S1355, the first data line control signal DIO1 and the second data line control signal DIO2 are simultaneously or sequentially generated as H pulses, so that the logic states of the first and second latch data DLT1 and DLT2 are read out (refer to C10 of FIG. 19b). At step S1360, it is verified whether the above programming has succeeded.

If programming has failed, the process may be repeated from step S1330. At this time, the voltage level of a selected word line or bit line at step S1330 gradually increases.

Meanwhile, variations in the voltage level of the sensing node NSEN and the logic states of the first and second latch data DLT1 and DLT2 at steps S1335, S1340, S1345, and S1350 of FIG. 19b will be apparent to those skilled in the art when referring to steps S1140 and S1150 of FIG. 12, so that the detailed descriptions thereof are omitted.

Figure 20:
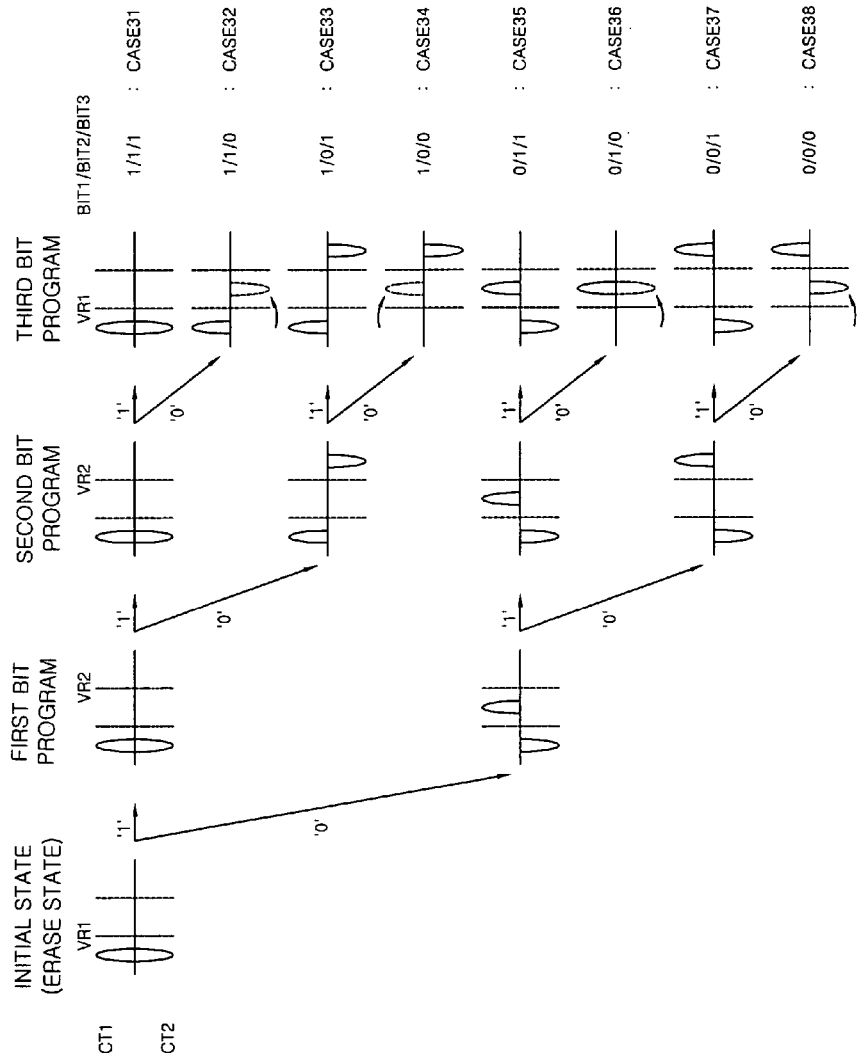
FIG. 20 is a view showing a variation in the threshold voltages of first and second charge trap regions after the third page programming step has been performed in the programming method for the non-volatile semiconductor memory device according to the present invention.

FIG. 20 is a view showing a variation in the threshold voltages of first and second charge trap regions CT1 and CT2 after the third page programming step has been performed in the programming method for the non-volatile semiconductor memory device according to the present invention.

When all of the first, second, and third data bits BIT1, BIT2, and BIT3 are "1" (CASE31), the threshold voltages of the first and second charge trap regions CT1 and CT2 are maintained at an erase state, that is, at the first threshold voltage group G1.

When the first and second data bits BIT1 and BIT2 are "1" and the third data bit BIT3 is "0" (CASE32), the threshold voltage of the first charge trap region CT1 is maintained at the first threshold voltage group G1, and the threshold voltage of the second charge trap region CT2 is adjusted to the second threshold voltage group G2.

When the first data bit BIT1 is "1," the second data bit BIT2 is "0," and the third data bit BIT3 is "1" (CASE33), the threshold voltage of the first charge trap region CT1 is maintained at the first threshold voltage group G1, and the threshold voltage of the second charge trap region CT2 is maintained at the third threshold voltage group G3.

When the first data bit BIT1 is "1," the second data bit BIT2 is "0," and the third data bit BIT3 is "0" (CASE34), the threshold voltage of the first charge trap region CT1 is adjusted to the second threshold voltage group G2, and the threshold voltage of the second charge trap region CT2 is maintained at the third threshold voltage group G3.

When the first data bit BIT1 is "0," the second data bit BIT2 is "1" and the third data bit BIT3 is "1" (CASE35), the threshold voltage of the first charge trap region CT1 is maintained at the second threshold voltage group G2, and the threshold voltage of the second charge trap region CT2 is maintained at the first threshold voltage group G1.

When the first data bit BIT1 is "0," the second data bit BIT2 is "1," and the third data bit BIT3 is "0" (CASE36), the threshold voltage of the first charge trap region CT1 is maintained at the second threshold voltage group G2, and the threshold voltage of the second charge trap region CT2 is adjusted to the second threshold voltage group G2.

When the first data bit BIT1 is "0," the second data bit BIT2 is "0" and the third data bit BIT3 is "1" (CASE37), the threshold voltage of the first charge trap region CT1 is maintained at the third threshold voltage group G3, and the threshold voltage of the second charge trap region CT2 is maintained at the first threshold voltage group G1.

When all of the first, second and third data bits BIT1, BIT2 and BIT3 are "0" (CASE38), the threshold voltage of the first charge trap region CT1 is maintained at the third threshold voltage group G3, and the threshold voltage of the second charge trap region CT2 is adjusted to the second threshold voltage group G2.

Further, in the driving method for the 3-level non-volatile semiconductor memory device of the present invention, the threshold voltages of the first and second charge trap regions CT1 and CT2 are simultaneously controlled depending on the three sequentially provided data bits BIT1, BIT2 and BIT3. Also, it can be verified whether the above programming has succeeded through only one or two verify read operations for each data bit value.

A reading method for a non-volatile semiconductor memory device of the present invention will now be described. In this case, even though first to third page reading steps of reading first to third data bits BIT1 to BIT3, respectively, are non-sequentially performed, there is no problem in performing reading for a pair of charge trap regions.

Figure 21:
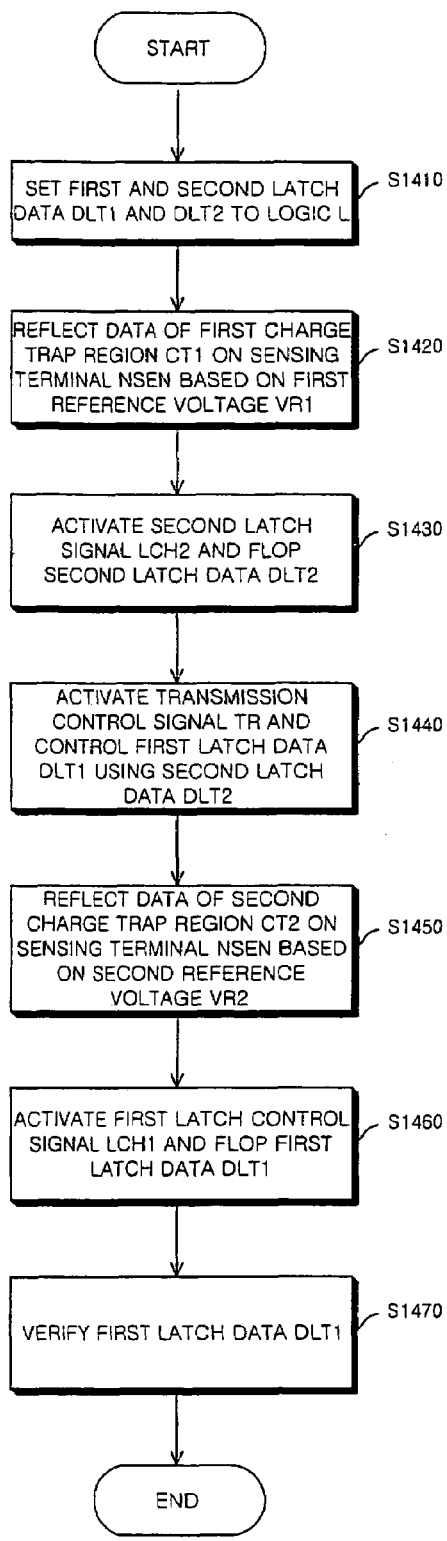
FIG. 21 is a flowchart showing a first page reading step in the reading method for the non-volatile semiconductor memory device according to the present invention.
Figure 22A:
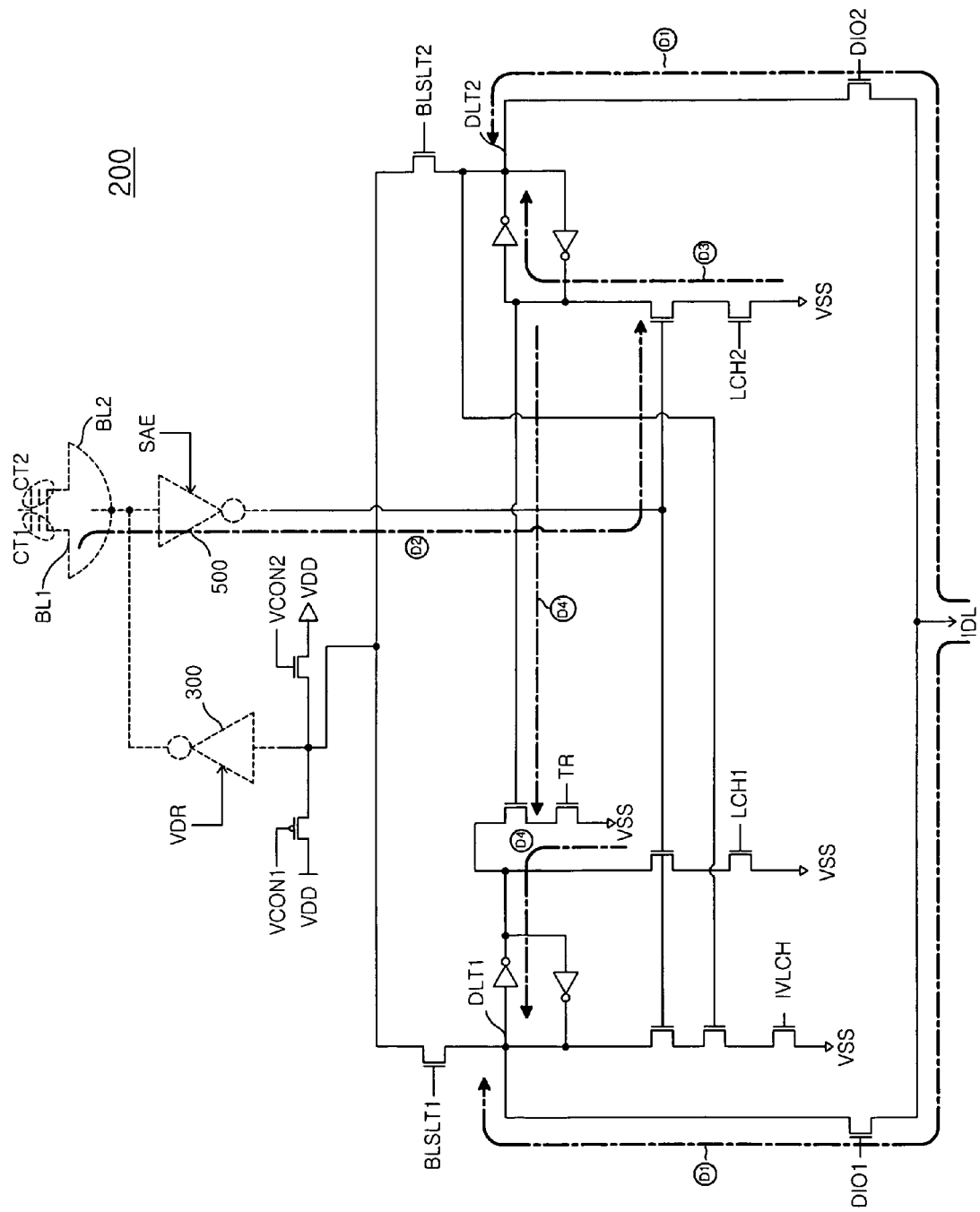
FIGS. 22a and 22b are data flow diagrams based on the flowchart of FIG. 21.
Figure 22B:
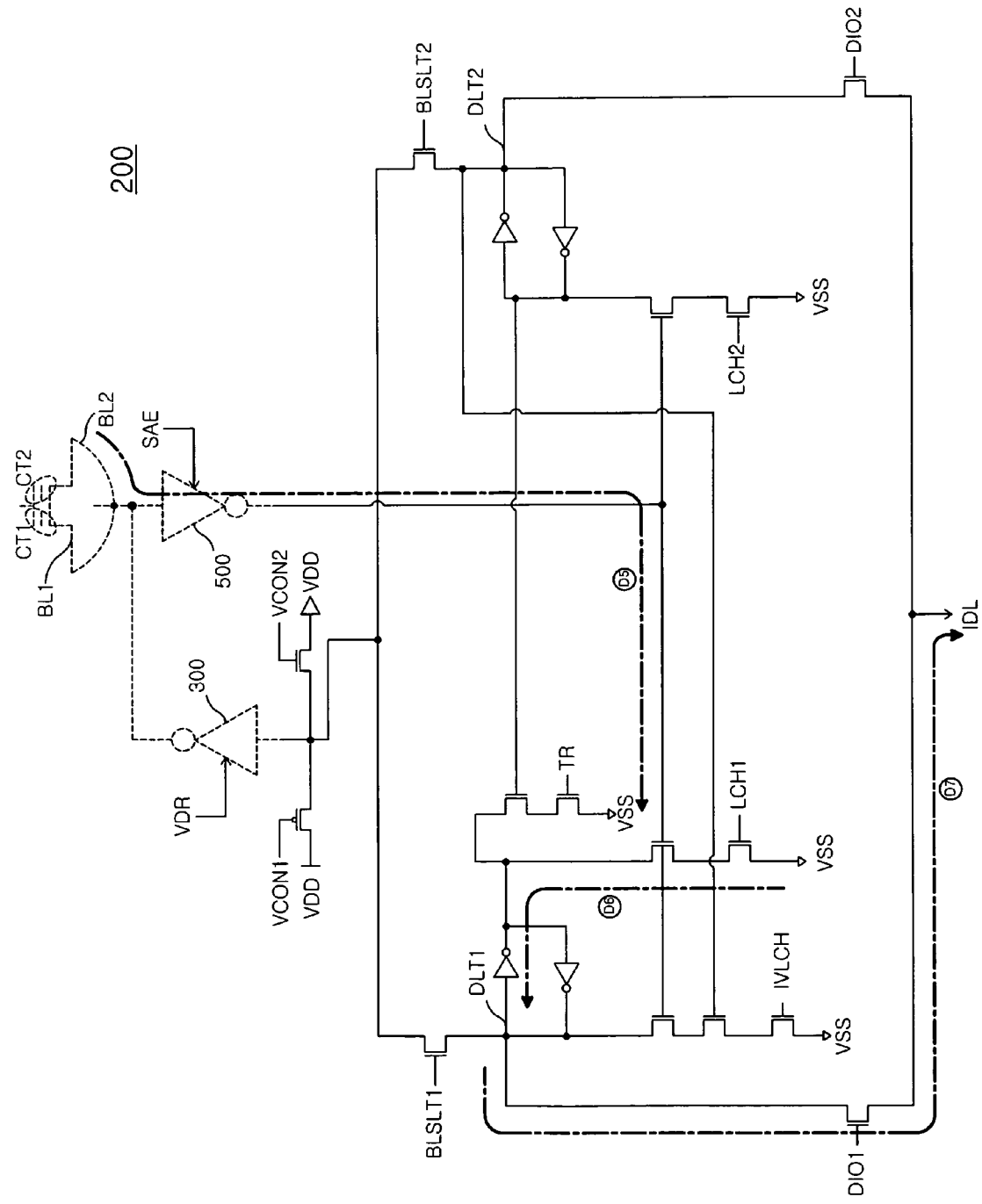

FIG. 21 is a flowchart showing a first page reading step in the reading method for the non-volatile semiconductor memory device according to the present invention. FIGS. 22a and 22b are data flow diagrams based on the flowchart of FIG. 21. At the first page reading step, the first charge trap region CT1 of a first threshold voltage group G1 and the second charge trap region CT2 of a third threshold voltage group G3 are verified, so that the first data bit BIT1 is read.

Referring to FIG. 21, at step S1410, first and second latch data DLT1 and DLT2 are set to a logic L state (refer to D1 of FIG. 22a).

Further, at steps S1420 and S1430, a data fetching step of controlling the second latch data DLT2, using data depending on the threshold voltage of the first charge trap region CT1 which is verified based on a first reference voltage VR1, is performed.

In detail, at step S1420, the threshold voltage of the first charge trap region CT1 is reflected on the sensing node NSEN, based on the first reference voltage VR1 (refer to D2 of FIG. 22a). At step 1430, a second latch control signal LCH2 is generated as an H pulse. At this time, the second latch data DLT2 selectively flops from a logic L state to a logic H state depending on the voltage level of the sensing node NSEN (refer to D3 of FIG. 22a).

Further, at step S1440, a transmission control signal TR is activated to a logic H state. Therefore, at step S1440, a transmission step of controlling the first latch data DLT1, set at step S1410, using the second latch data DLT2 controlled at step S1430, is performed (refer to D4 and D4' of FIG. 22a).

The logic state of the first latch data DLT1 after step S1440 has been performed is described below. When the threshold voltage of the first charge trap region CT1 belongs to the first threshold voltage group G1 (CASE31, CASE32, and CASE33 of FIG. 20), the first latch data DLT1 is adjusted to a logic H state from a logic L state. In contrast, when the threshold voltage of the first charge trap region CT1 belongs to the second or third threshold voltage group G2 or G3 (CASE34 to CASE38 of FIG. 20), the first latch data DLT1 is maintained at a logic L state.

Further, at steps S1450 and S1460, a flop step of flopping the first latch data DLT1, using data depending on the threshold voltage of the second charge trap region CT2, which is verified based on a second reference voltage VR2, is performed.

In detail, at step S1450, the threshold voltage of the second charge trap region CT2 is reflected on the sensing node NSEN, based on the second reference voltage VR2 (refer to D5 of FIG. 22b). At step S1460, a first latch control signal LCH1 is generated as an H pulse. In this case, the first latch data DLT1 selectively flops from a logic L state to a logic H state depending on the voltage level of the sensing node NSEN (refer to D6 of FIG. 22b).

Variation in the logic state of the first latch data DLT1 at step S1460 is described below. That is, when the threshold voltage of the second charge trap region CT2 belongs to the third threshold voltage group G3 (CASE33 and CASE34 of FIG. 20), the first latch data DLT1 is adjusted to a logic H state from a logic L state. However, in the remaining cases, the first latch data DLT1 is maintained at its previous state.

A variation in the logic state of the first latch data DLT1 after steps S1440 and S1460 have been performed is described below. When the threshold voltage of the first charge trap region CT1 belongs to the first threshold voltage group G1, or when the threshold voltage of the second charge trap region CT2 belongs to the third threshold voltage group G3 (CASE31 to CASE34 of FIG. 20), that is, when the first data bit BIT1 is "1," the first latch data DLT1 is adjusted to a logic H state from a logic L state. However, in the remaining cases (CASE35 to CASE38 of FIG. 20), when the first data bit BIT1 is "0," the first latch data DLT1 is maintained at a logic L state.

At step S1470, a data verify step of generating a first data line control signal DIO1 as an H pulse, reading out the logic state of the first latch data DLT1, and verifying the first data bit BIT1, is performed (refer to D7 of FIG. 22b).

In the present embodiment, output data having a logic H state indicates that the first data bit BIT1 is "1" while output data having a logic L state indicates that the first data bit BIT1 is "0."

As described above, according to the driving method for the non-volatile semiconductor memory device of the present invention, the first data bit BIT1 can be verified through a single read operation.

Figure 23:
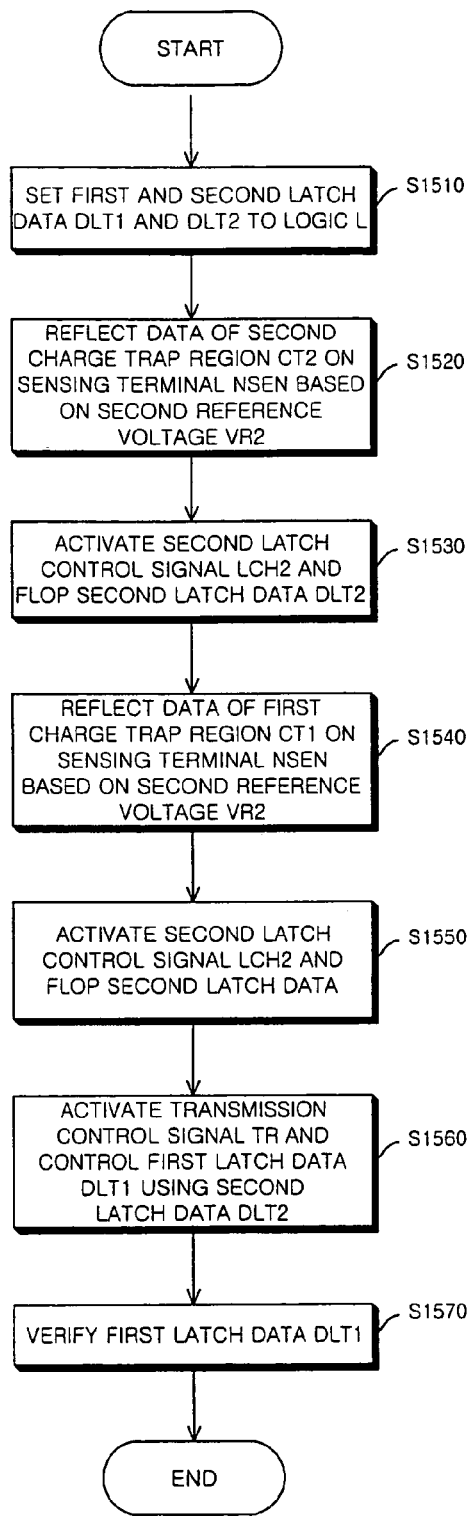
FIG. 23 is a flowchart showing a second page reading step in the reading method for the non-volatile semiconductor memory device according to the present invention.
Figure 24A:
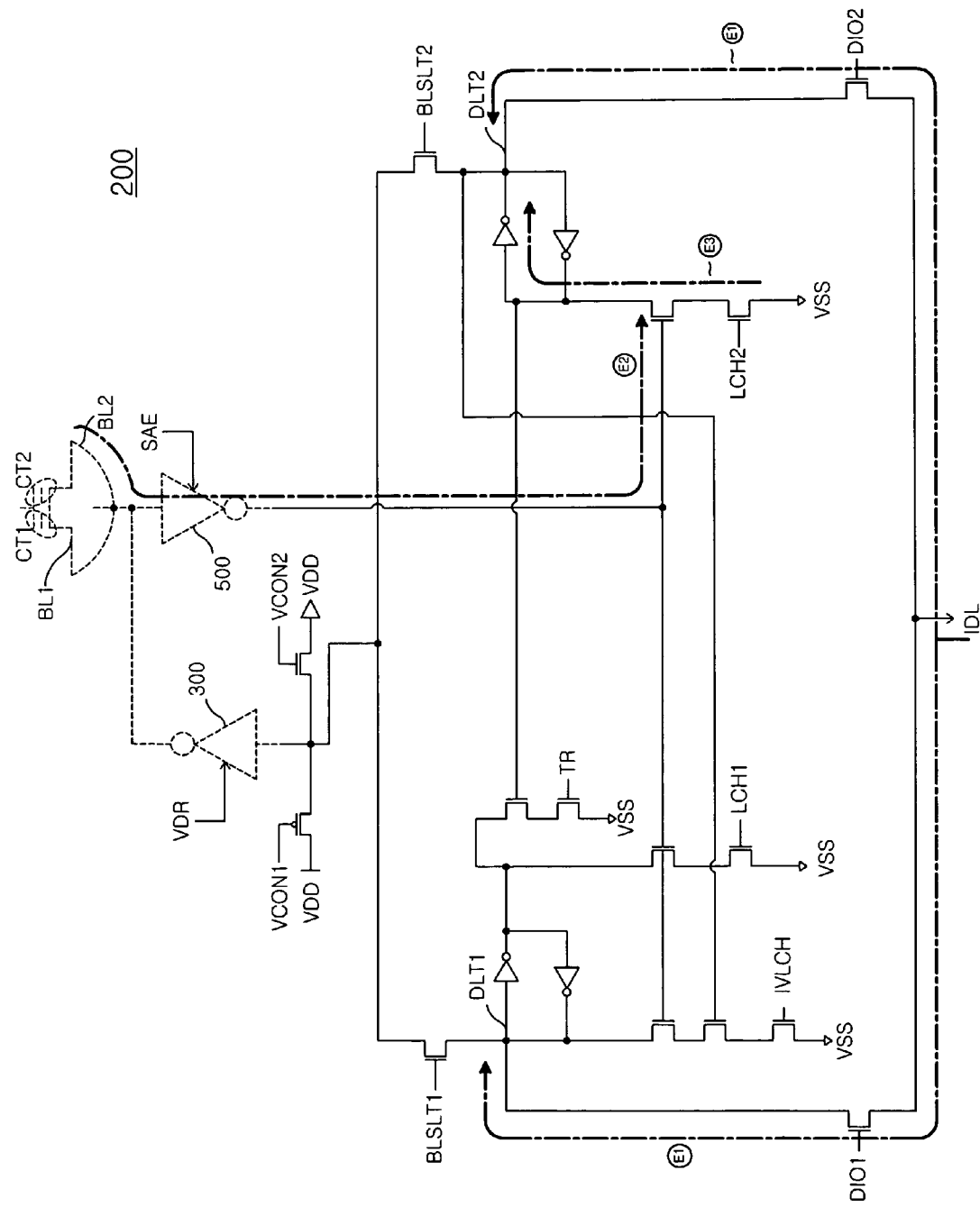
FIGS. 24a and 24b are data flow diagrams based on the flowchart of FIG. 23.
Figure 24B:
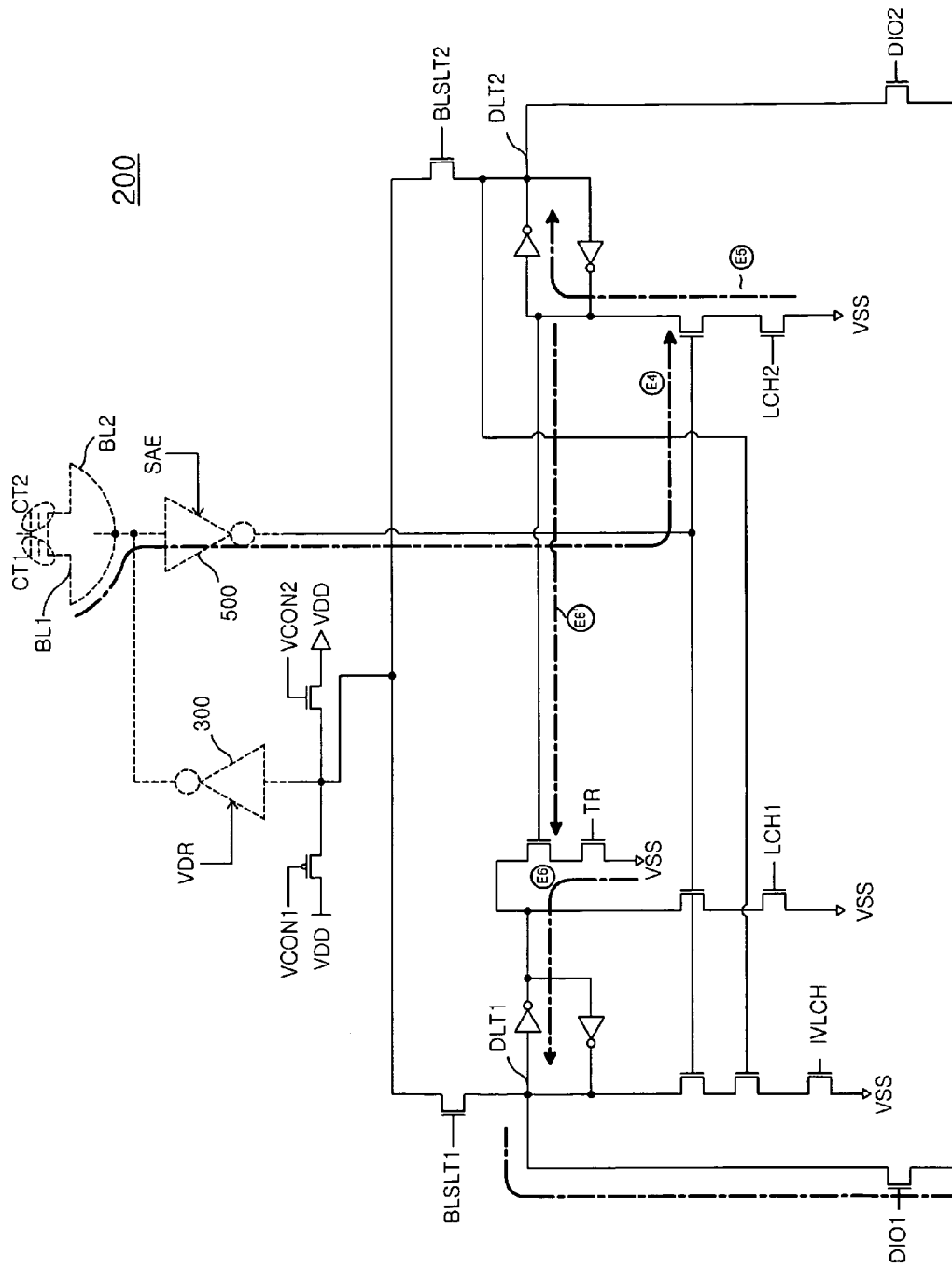

FIG. 23 is a flowchart showing a second page reading step in the reading method for the non-volatile semiconductor memory device according to the present invention. FIGS. 24a and 24b are data flow diagrams based on the flowchart of FIG. 23. At the second page reading step, the first or second charge trap region CT1 or CT2 of the third threshold voltage group G3 is verified, so that the second data bit BIT2 is read.

Referring to FIG. 23, at step S1510, first and second latch data DLT1 and DLT2 are set to a logic L state (refer to E1 of FIG. 24a).

Further, at steps S1520 and S1530, a first data fetching step of controlling the second latch data DLT2, using data depending on the threshold voltage of the second charge trap region CT2, which is verified based on the second reference voltage VR2, is performed.

In detail, at step S1520, the threshold voltage of the second charge trap region CT2 is reflected on the sensing node NSEN, based on the second reference voltage VR2 (refer to E2 of FIG. 24a). At step S1530, the second latch control signal LCH2 is generated as an H pulse. In this case, the second latch data DLT2 selectively flops from a logic L state to a logic H state depending on the voltage level of the sensing node NSEN (refer to E3 of FIG. 24a).

The logic state of the second latch data DLT2 after step S1530 has been performed is described below. That is, when the threshold voltage of the second charge trap region CT2 belongs to the third threshold voltage group G3 (CASE33 and CASE34 of FIG. 20), the second latch data DLT2 is adjusted to a logic H state from a logic L state. However, in the remaining cases (CASE31, CASE32, and CASE35 to CASE38 of FIG. 20), the second latch data DLT2 is maintained at a logic L state.

Further, at steps S1540 and S1550, a second data fetching step of controlling the second latch data DLT2, using data depending on the threshold voltage of the first charge trap region CT1, which is verified based on the second reference voltage VR2, is performed.

In detail, at step S1540, the threshold voltage of the first charge trap region CT1 is reflected on the sensing node NSEN, based on the second reference voltage VR2 (refer to E4 of FIG. 24b). At step S1550, the second latch control signal LCH2 is generated as an H pulse. In this case, the second latch data DLT2 selectively flops from a logic L state to a logic H state depending on the voltage level of the sensing node NSEN (refer to E5 of FIG. 24b).

The logic state of the second latch data DLT2 after step S1550 has been performed is described below. That is, when the threshold voltage of the first charge trap region CT1 belongs to the third threshold voltage group G3 (CASE37 and CASE38 of FIG. 20), the second latch data DLT2 is adjusted to a logic H state from a logic L state. However, in the remaining cases (CASE31 to CASE36 of FIG. 20), the second latch data DLT2 is maintained at its previous logic state.

At step S1560, the transmission control signal TR is activated to a logic H state. Therefore, at step S1560, a transmission step of controlling the first latch data DLT1, set at step S1510, using the second latch data DLT2, controlled at steps S1530 and S1550, is performed (refer to E6 and E6' of FIG. 24b).

The logic state of the first latch data DLT1 after step S1560 has been performed is described below. That is, when the threshold voltage of the first charge trap region CT1 or the second charge trap region CT2 belongs to the third threshold voltage group G3 (CASE33, CASE34, CASE37, and CASE38 of FIG. 20), the first latch data DLT1 is adjusted to a logic H state from a logic L state. However, in the remaining cases (CASE31, CASE32, CASE35, and CASE36 of FIG. 20), the first latch data DLT1 is maintained at a logic L state.

At step S1570, a data verify step of generating the first data line control signal DIO1 as an H pulse, reading out the logic state of the first latch data DLT1, and verifying the second data bit BIT2, is performed (refer to E7 of FIG. 24b). In this embodiment, output data having a logic H state indicates that the second data bit BIT2 is "1," and output data having a logic L state indicates that the second data bit BIT2 is "0."

As described above, according to the driving method for the non-volatile semiconductor memory device of the present invention, the value of the second data bit BIT2 can be verified through a single read operation.

Figure 25A:
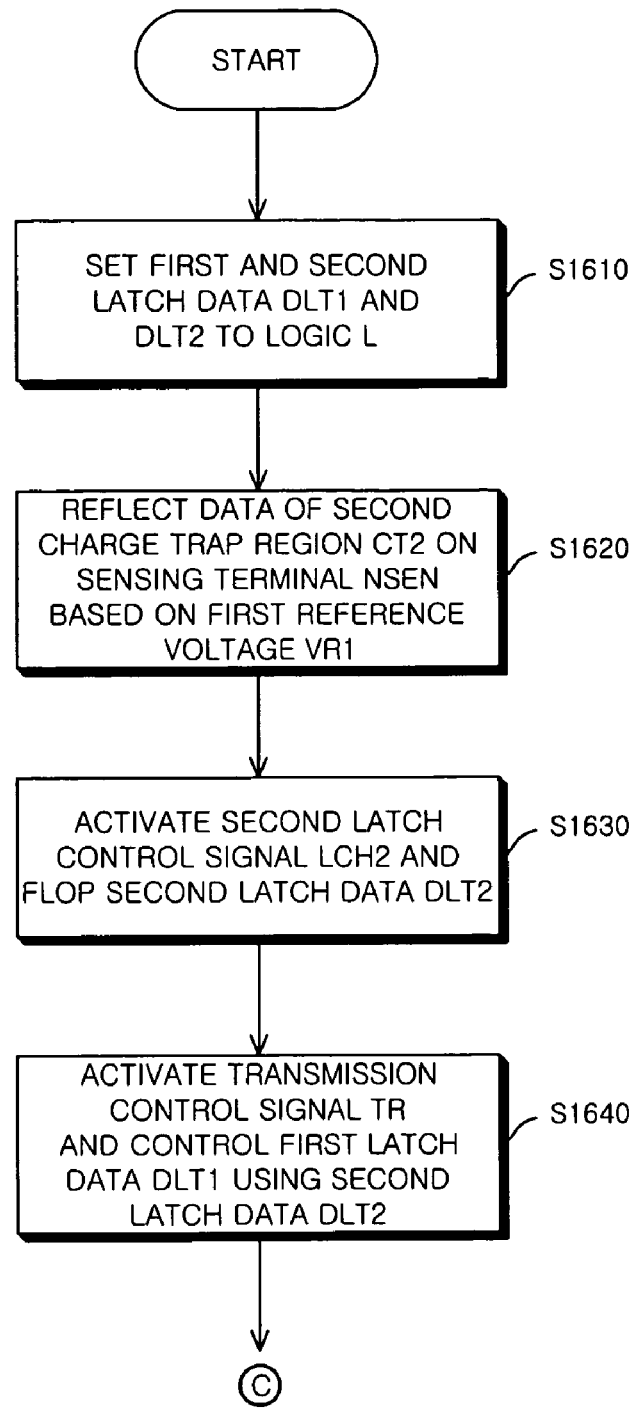
FIGS. 25a and 25b are flowcharts showing a third page reading step in the reading method for the non-volatile semiconductor memory device according to the present invention.
Figure 25B:
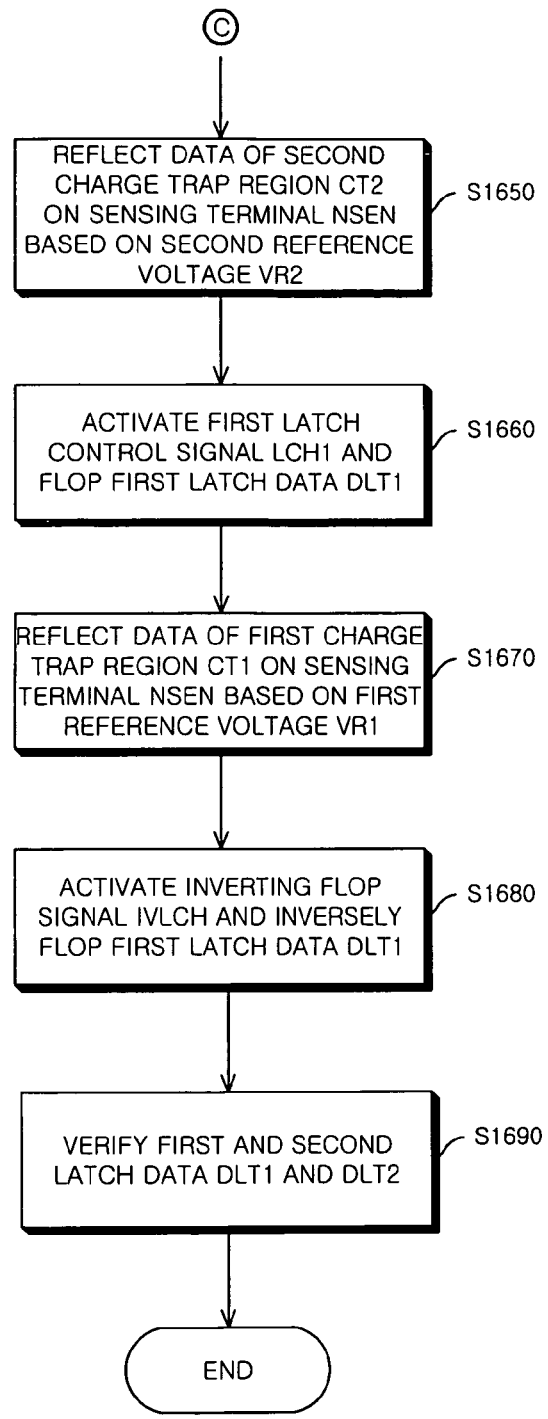
Figure 26A:
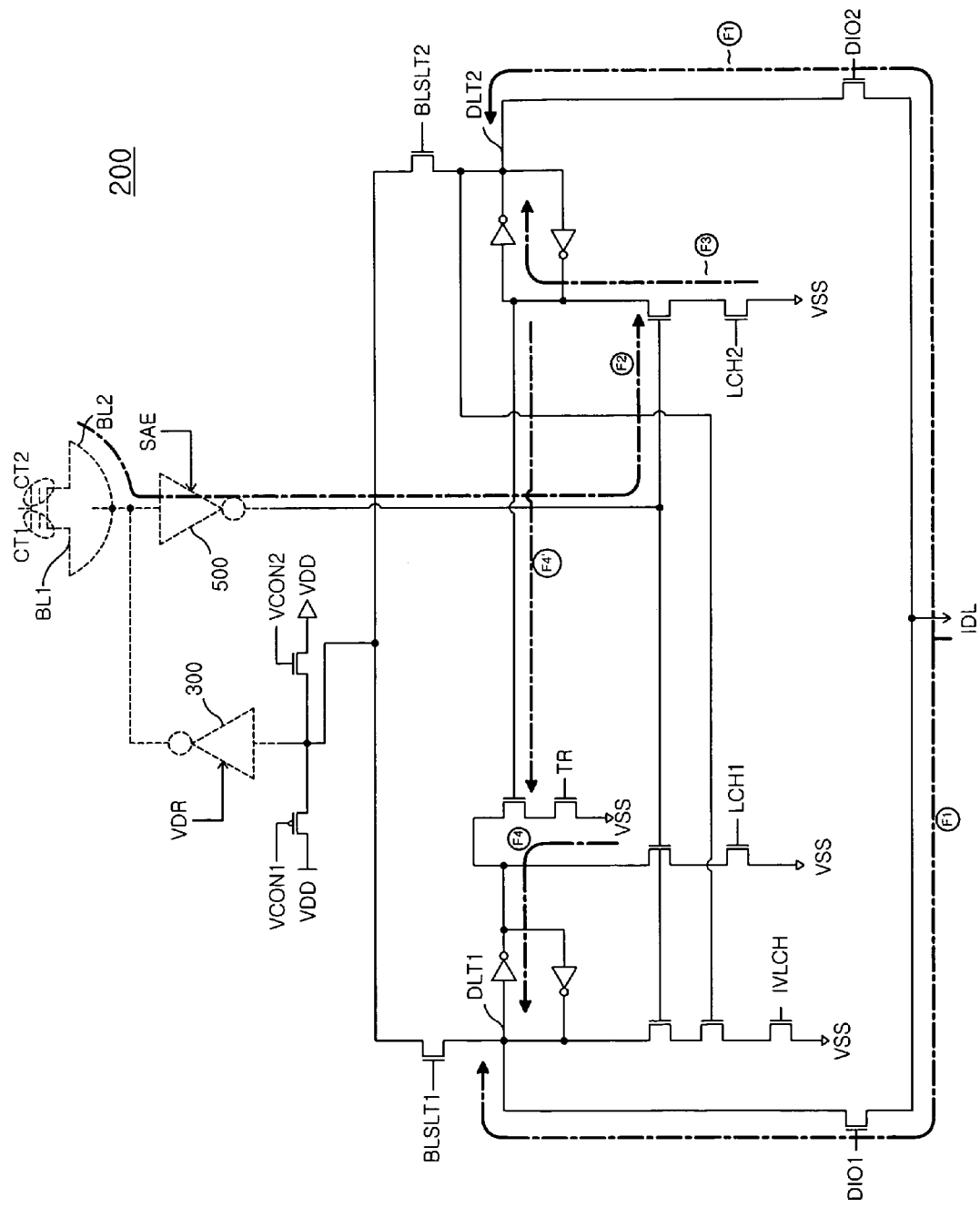
FIGS. 26a and 26b are data flow diagrams based on the flowcharts of FIGS. 25a and 25b.
Figure 26B:
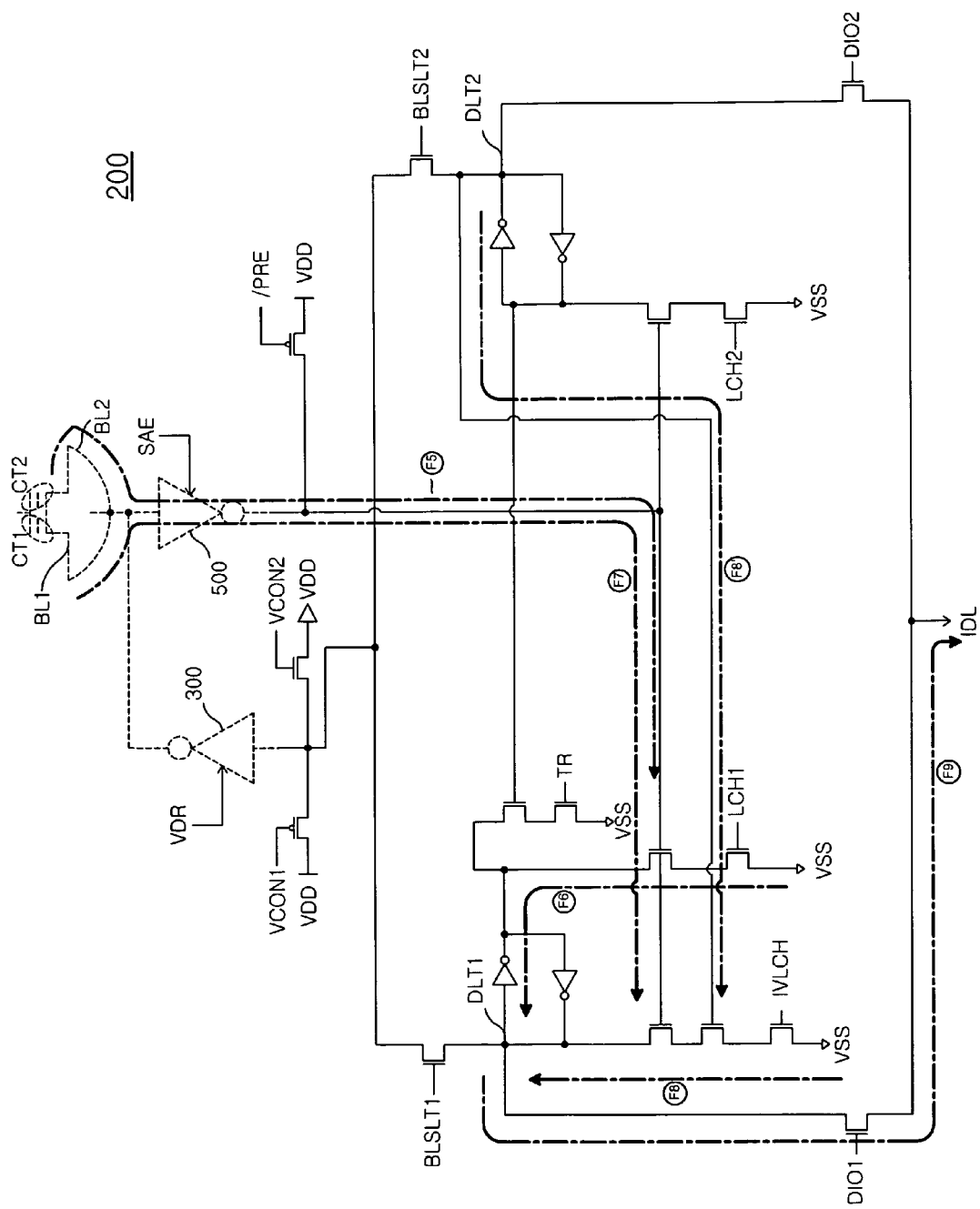

FIGS. 25a and 25b are flowcharts showing a third page reading step in the reading method for the non-volatile semiconductor memory device according to the present invention. FIGS. 26a and 26b are data flow diagrams based on the flowcharts of FIGS. 25a and 25b. At the third page reading step, the second charge trap region CT2 of the first threshold voltage group G1 or the third threshold voltage group G3 is verified, and the first charge trap region CT1 of the second threshold voltage group G2 is excluded, so that the third data bit BIT3 is read.

Referring to FIGS. 25a and 25b, at step S1610, first and second latch data DLT1 and DLT2 are set to a logic L state (refer to F1 of FIG. 26a).

At steps S1620 and S1630, a data fetching step of controlling the second latch data DLT2, using data depending on the threshold voltage of the second charge trap region CT2, which is verified based on the first reference voltage VR1, is performed.

In detail, at step S1620, the threshold voltage of the second charge trap region CT2 is reflected on the sensing node NSEN, based on the first reference voltage VR1 (refer to F2 of FIG. 26a). At step S1630, the second latch control signal LCH2 is generated as an H pulse. At this time, the second latch data DLT2 selectively flops from a logic L state to a logic H state depending on the voltage level of the sensing node NSEN (refer to F3 of FIG. 26a).

At step S1640, the transmission control signal TR is activated to a logic H state. Therefore, at step S1640, a transmission step of controlling the first latch data DLT1, set at step S1610, using the second latch data DLT2 obtained at step S1630, is performed (refer to F4 and F4' of FIG. 26a).

The logic state of the first latch data DLT1 after step S1640 has been performed is described below. That is, when the threshold voltage of the second charge trap region CT2 belongs to the first threshold voltage group G1 (CASE31, CASE35, and CASE37 of FIG. 20), the first latch data DLT1 is adjusted to a logic H state from a logic L state. In contrast, when the threshold voltage of the first charge trap region CT1 belongs to the second or third threshold voltage group G2 or G3 (CASE32, CASE33, CASE34, CASE36, and CASE38 of FIG. 20), the first latch data DLT1 is maintained at a logic L state.

Further, at steps S1650 and S1660, a flop step of flopping the first latch data DLT1, using data depending on the threshold voltage of the second charge trap region CT2, which is verified based on the second reference voltage VR2, is performed.

In detail, at step S1650, the threshold voltage of the second charge trap region CT2 is reflected on the sensing node NSEN, based on the second reference voltage VR2 (refer to F5 of FIG. 26b). At step S1660, the first latch control signal LCH1 is generated as an H pulse. In this case, the first latch data DLT1 selectively flops from a logic L state to a logic H state depending on the voltage level of the sensing node NSEN (refer to F6 of FIG. 26b).

A variation in the logic state of the first latch data DLT1 at step S1660 is described below. When the threshold voltage of the second charge trap region CT2 belongs to the third threshold voltage group G3 (CASE33 and CASE34 of FIG. 20), the first latch data DLT1 is adjusted to a logic H state from a logic L state. In contrast, in the remaining cases, the first latch data DLT1 is maintained at its previous logic state.

In this case, a variation in the logic state of the first latch data DLT1 after steps S1640 and S1660 have been performed is described below. When the threshold voltage of the second charge trap region CT2 belongs to the first threshold voltage group G1 or the third threshold voltage group G3 (CASE31, CASE35, CASE37, CASE33, and CASE34 of FIG. 20), the first latch data DLT1 is adjusted to a logic H state from a logic L state. However, in the remaining cases (CASE32, CASE36, and CASE38 of FIG. 20), the first latch data DLT1 is maintained at a logic L state.

Further, at steps S1670 and S1680, an inverting flop step of inversely flopping the first latch data DLT1, using data depending on the threshold voltage of the first charge trap region CT1 which is verified based on the first reference voltage VR1, is performed. In this case, the inverting flop of the first latch data DLT1 is enabled in response to the second latch data DLT2 flopped at step S1630.

In detail, at step S1670, the threshold voltage of the first charge trap region CT1 is reflected on the sensing node NSEN, based on the first reference voltage VR1 (refer to F7 of FIG. 26b). At step S1680, an inverting latch signal IVLCH is generated as an H pulse. In this case, the first latch data DLT1 selectively inversely flops from a logic H state to a logic L state depending on the voltage level of the sensing node NSEN and the second latch data DLT2 (refer to F8 and F8' of FIG. 26b).

In other words, the first latch data DLT1 selectively inversely flops from a logic H state to a logic L state depending on the voltage level of the sensing node NSEN. At this time, the inverting flop of the first latch data DLT1 can be performed only when the second latch data DLT2 flops to a logic H state.

Therefore, the inverting flop of the first latch data DLT1 from a logic H state to a logic L state occurs only when the threshold voltage of the first charge trap region CT1 belongs to the second threshold voltage group G2 and the threshold voltage of the second charge trap region CT2 belongs to the third threshold voltage group G3 (CASE34 of FIG. 20).

The logic state of the first latch data DLT1 after step S1680 has been performed is described below. In the cases CASE31, CASE33, CASE35, and CASE37 of FIG. 20, the logic state of the first latch data DLT1 is logic H. Further, in the cases CASE32, CASE34, CASE36, and CASE38 of FIG. 20, the logic state of the first latch data DLT1 is logic L.

At step S1690, a data verify step of generating the first data line control signal DIO1 as an H pulse, reading out the logic state of the first latch data DLT1, and verifying the third data bit BIT3, is performed (refer to F9 of FIG. 26b).

As described above, according to the driving method for the non-volatile semiconductor memory device of the present invention, the third data bit BIT3 can be verified through a single read operation.

In summary, according to the reading method for the non-volatile semiconductor memory device of the present invention, each of the first through third data bits BIT1 to BIT3 can be verified by outputting data only once.

As described above, the charge trap-type non-volatile semiconductor memory device of the present invention includes charge trap regions CT1 and CT2, each storing 1.5 bits of data. That is, a single memory element has charge trap regions for storing 3 bits of data. Therefore, according to the non-volatile semiconductor memory device, a degree of integration can be remarkably improved. Further, in the programming method for a 3-level non-volatile semiconductor memory device, the threshold voltages of first and second charge trap regions are simultaneously controlled depending on three sequentially provided bits. Therefore, according to the programming method for a 3-level non-volatile semiconductor memory device of the present invention, the overall operating speed can be very high during programming operations.

Further, in the reading method for a 3-level non-volatile semiconductor memory device of the present invention, each data bit value can be independently verified through only a single read operation. Therefore, according to the reading method for a 3-level non-volatile semiconductor memory device of the present invention, the overall operating speed can also be very high during reading operations.

Although embodiments of the present invention have been disclosed for illustrative purposes, those skilled in the art will appreciate that various modifications, additions and substitutions are possible, without departing from the scope and spirit of the invention as disclosed in the accompanying claims.

Figure 27:
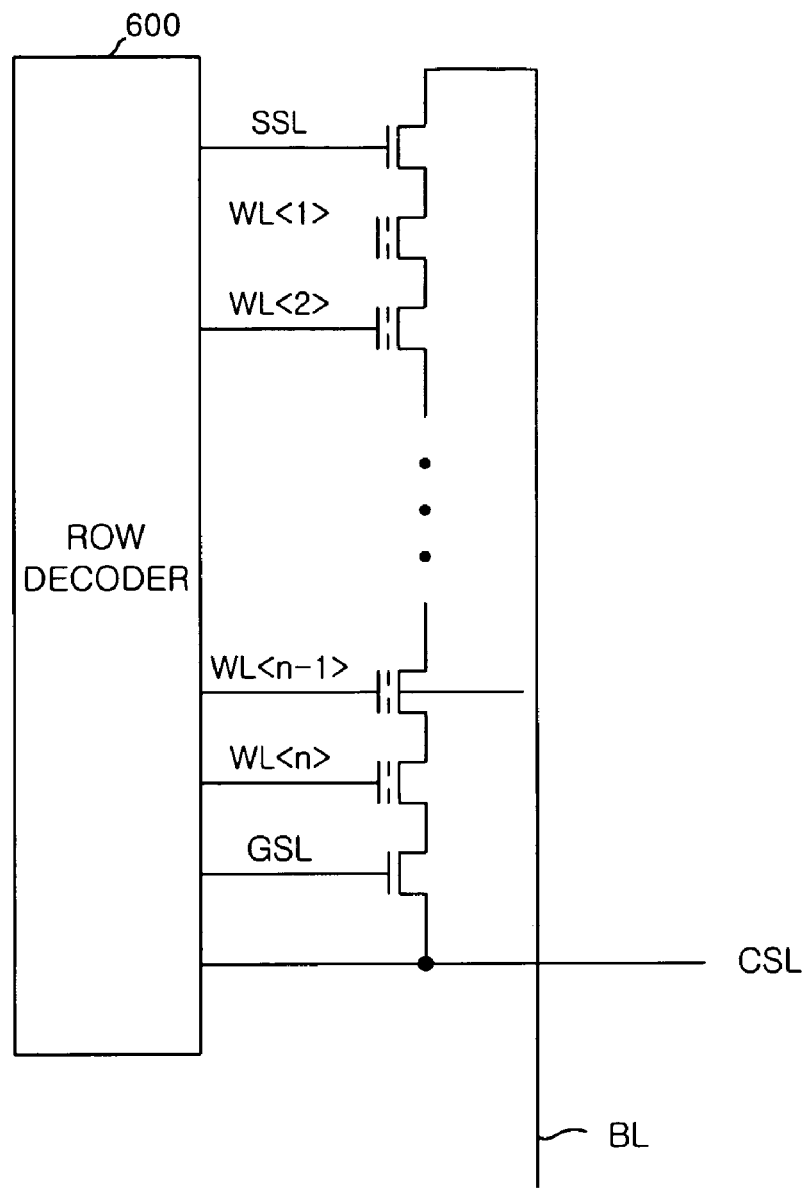
FIG. 27 is a diagram showing part of the memory array of FIG. 7 according to another embodiment of the present invention, which shows the memory array of a NAND-type non-volatile semiconductor memory device.

For example, as shown in FIG. 27, the memory array shown in FIG. 7 may be implemented with a NAND-type memory device instead of a NOR-type memory device without departing from the scope and spirit of the present invention. The structure of a data control circuit can also be suitably modified to accommodate this or other various embodiments, so that the technical spirit of the present invention can be realized.

Therefore, the technical scope of the present invention must be defined by the accompanying claims.

What is claimed is:

1. A non-volatile semiconductor memory device, comprising:
   a memory array including a plurality of memory elements each capable of storing data in at least two charge trap regions depending on a direction of current flow;
   a page buffer driven to map three data bits to threshold voltage groups of the two charge trap regions; and
   a row decoder for controlling a word line of a selected memory element of the memory array.

2. The non-volatile semiconductor memory device according to claim 1, wherein the two charge trap regions are formed in a single memory element.

3. The non-volatile semiconductor memory device according to claim 1, wherein the page buffer comprises:
   a transmission node capable of providing data to the memory array;
   a sensing node capable of sensing data from the memory array;
   a first latch block capable of storing first latch data and mapping the first latch data to the transmission node, the first latch block selectively flopping the first latch data depending on a voltage level of the sensing node; and
   a second latch block capable of storing second latch data and mapping the second latch data to the transmission node, the second latch block selectively flopping the second latch data depending on the voltage level of the sensing node,
   wherein the first latch data inversely flops depending on the voltage level of the sensing node and a logic state of the second latch data.

4. The non-volatile semiconductor memory device according to claim 3, wherein the first latch block comprises:
   a first latch unit for storing the first latch data and mapping the first latch data to the transmission node in response to a first block selection signal;
   a first flop unit driven to change the first latch data from a first logic state to a second logic state; and
   an inverting flop unit driven to change the first latch data from the second logic state to the first logic state.

5. The non-volatile semiconductor memory device according to claim 4, wherein the first flop unit comprises:
   transmission means driven to change the first latch data from the first logic state to the second logic state depending on the logic state of the second latch data; and
   flop means driven to change the first latch data from the first logic state to the second logic state depending on the voltage level of the sensing node.

6. The non-volatile semiconductor memory device according to claim 4, wherein the inverting flop unit flops the first latch data from the second logic state to the first logic state depending on the voltage level of the sensing node, the flop of the first latch data being interrupted depending on the logic state of the second latch data.

7. The non-volatile semiconductor memory device according to claim 4, wherein the second latch block comprises:
a second latch unit for storing the second latch data, and mapping the second latch data to the transmission node in response to a second block selection signal; and
a second flop unit driven to change the second latch data from a first logic state to a second logic state.

8. The non-volatile semiconductor memory device according to claim 1, wherein the non-volatile semiconductor memory device is a NOR-type memory device.

9. The non-volatile semiconductor memory device according to claim 1, wherein the non-volatile semiconductor memory device is a NAND-type memory device.

10. A programming method for a non-volatile semiconductor memory device including a plurality of memory elements, each capable of storing data in at least two charge trap regions, the programming method programming three data bits in the first and second charge trap regions, the first and second charge trap regions each having a threshold voltage that belongs to first to third threshold voltage groups having sequentially increasing threshold voltages, the programming method comprising:
programming a first bit by programming the threshold voltage of at least one of the first and second charge trap regions in response to a state of the first data bit;
programming a second bit by programming the threshold voltage of at least one of the first and second charge trap regions in response to a state of the second data bit and a result of programming the first bit; and
programming a third bit by programming the threshold voltage of at least one of the first and second charge trap regions in response to a state of the third data bit and a result of programming the second bit.

11. The programming method according to claim 10, wherein:
programming the first bit includes programming the first charge trap region to the second threshold voltage group in response to the state of the first data bit,
programming the second bit includes programming a threshold voltage of any one of the first and second charge trap regions to the third threshold voltage group in response to the state of the second data bit, the charge trap region to be programmed to the third threshold voltage group being selected based on results of programming the first bit, and
programming the third bit includes programming a threshold voltage of any one of the first and second charge trap regions to the second threshold voltage group in response to the state of the third data bit, the charge trap region to be programmed to the second threshold voltage group being selected based on results of programming the second bit.

12. The programming method according to claim 11, wherein the non-volatile semiconductor memory device comprises a first latch unit for storing first latch data to program the first charge trap region, and a second latch unit for storing second latch data to program the second charge trap region.

13. The programming method according to claim 12, wherein programming the second bit comprises:

controlling the first and second latch data using the second data bit;
controlling the second latch data, using data programmed in the first charge trap region;
controlling the first latch data, using the controlled second latch data; and
controlling threshold voltages of the first and second charge trap regions using the controlled first and second latch data.

14. The programming method according to claim 12, wherein programming the third bit comprises:
controlling the first and second latch data using the third data bit;
controlling the second latch data, using data programmed in the second charge trap region;
controlling the first latch data, using the second latch data controlled using the data programmed in the second charge trap region; and
controlling threshold voltages of the first and second charge trap regions using the controlled first and second latch data.

15. The programming method according to claim 10, wherein the non-volatile semiconductor memory device is a NOR-type memory device.

16. The programming method according to claim 10, wherein the non-volatile semiconductor memory device is a NAND-type memory device.

17. A reading method for a non-volatile semiconductor memory device including a plurality of memory elements, each capable of storing data in at least two charge trap regions depending on a direction of current flow, the reading method reading three data bits stored in the first and second charge trap regions, the first and second charge trap regions each having a threshold voltage that belongs to first to third threshold voltage groups having sequentially increasing threshold voltages, the reading method comprising:
reading a first data bit by determining the threshold voltage group of the threshold voltage of the first charge trap region and by determining the threshold voltage group of the threshold voltage of the second charge trap region;
reading a second data bit by determining the threshold voltage group of the threshold voltage of the first charge trap region and by determining the threshold voltage group of the threshold voltage of the second charge trap region; and
reading a third data bit by determining the threshold voltage group of the threshold voltage of the first charge trap region and by determining the threshold voltage group of the threshold voltage of the second charge trap region.

18. The reading method according to claim 17, wherein:
reading the first data bit includes verifying the threshold voltage in the first threshold voltage group of the first charge trap region and the threshold voltage in the third threshold voltage group of the second charge trap region,
reading the second data bit includes verifying the threshold voltage in the third threshold voltage group of the first and second charge trap regions, and
reading the third data bit includes verifying the threshold voltage in the second threshold voltage group of the first charge trap region and the threshold voltage in the first and third threshold voltage groups of the second charge trap region.

19. The reading method according to claim 18, wherein the non-volatile semiconductor memory device comprises a first latch unit for storing first latch data to program the first charge trap region, and a second latch unit for storing second latch data to program the second charge trap region.

20. The reading method according to claim 19, wherein reading the first data bit comprises:

setting the first and second latch data;

flopping the second latch data, using data depending on the threshold voltage of the first charge trap region which is verified based on a first reference voltage between the first and second threshold voltage groups;

controlling the first latch data using the second latch;

flopping the first latch data, using data depending on the threshold voltage of the second charge trap region, which is verified based on a second reference voltage between the second and third threshold voltage groups; and verifying the first latch data.

21. The reading method according to claim 19, wherein reading the second data bit comprises:

setting the first and second latch data;

controlling the second latch data, using data depending on the threshold voltage of the second charge trap region, which is verified based on a second reference voltage between the second and third threshold voltage groups;

controlling the second latch data, using data depending on the threshold voltage of the first charge trap region, which is verified based on the second reference voltage;

controlling the first latch data using the second latch data; and verifying the first latch data.

22. The reading method according to claim 19, wherein reading the third data bit comprises:

setting the first and second latch data;

controlling the second latch data using data depending on the threshold voltage of the second charge trap region, which is verified based on a first reference voltage between the first and second threshold voltage groups;

controlling the first latch data using the second latch data;

flopping the first latch data, using data depending on a threshold voltage of the second charge trap region, which is verified based on a second reference voltage between the second and third threshold voltage groups;

inversely flopping the first latch data, using data depending on the threshold voltage of the first charge trap region, which is verified based on the first reference voltage, where the first latch data is inversely flopped in response to the flopped second latch data; and verifying the first latch data obtained from the controlled first latch data and from the inversely flopped first latch data.

23. The reading method according to claim 17, wherein the non-volatile semiconductor memory device is a NOR-type memory device.

24. The reading method according to claim 17, wherein the non-volatile semiconductor memory device is a NAND-type memory device.

* * * * *